United States Patent [19]

Sotokawa et al.

[11] Patent Number: 5,753,372
[45] Date of Patent: May 19, 1998

[54] WIRING STRUCTURES AND METHOD OF MANUFACTURING THE SAME

[75] Inventors: Hideo Sotokawa, Yokohama; Miharu Otani, Atsugi; Fumio Kataoka; Fusaji Shoji, both of Yokohama; Haruhiko Matsuyama, Hiratsuka; Eiji Matsuzaki, Yokohama; Shogi Ikeda, Chousei-gun; Hidetaka Shigi, Ashigarashimo-gun; Tetsuya Yamazaki; Naoki Matsushima, both of Yokohama; Shirou Akamatsu, Kodaira, all of Japan

[73] Assignee: Hitachi, Ltd., Tokyo, Japan

[21] Appl. No.: 500,157

[22] Filed: Jul. 10, 1995

[30] Foreign Application Priority Data

Jul. 13, 1994 [JP] Japan .................................. 6-161371
Jul. 26, 1994 [JP] Japan .................................. 6-174487

[51] Int. Cl.$^6$ .................................................. B32B 9/04
[52] U.S. Cl. .................. 428/411.1; 428/195; 428/457; 428/473.5
[58] Field of Search .................. 428/195, 411.1, 428/473.5, 457; 427/195

[56] References Cited

U.S. PATENT DOCUMENTS

| | | | |
|---|---|---|---|
| 2,936,296 | 5/1960 | Precopio et al. | 260/33.4 |
| 3,837,819 | 9/1974 | Hibbs, Jr. | 29/199 |
| 4,217,389 | 8/1980 | Peterson | 428/383 |
| 4,400,226 | 8/1983 | Horrigan | 156/56 |

OTHER PUBLICATIONS

Journal of Vacuum Science and Technology. A. pp. 1402–1412, vol. 7, No. 3, (1989) "A Study of the chemical and physical interaction between . . . ".

(List continued on next page.)

Primary Examiner—William Krynski

Attorney, Agent, or Firm—Antonelli, Terry, Stout, & Kraus LLP

[57] ABSTRACT

The present invention provides the wiring structure having a wiring layer and insulation layer and the method of manufacturing the same, wherein at least a part of the wiring of said wiring layer comprises copper, and said insulation layer comprises the polyimide obtained by heating the polyimide precursor composition containing the polyimide precursor having the repeating unit which can be represented by the following general formula (Chemical formula 15).

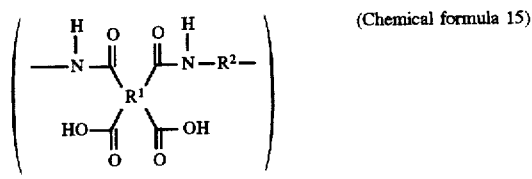

(Chemical formula 15)

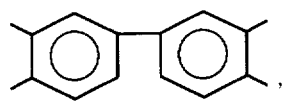

(Chemical formulae 16)

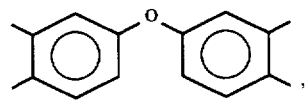

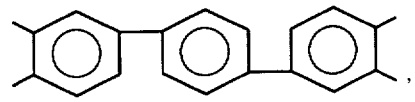

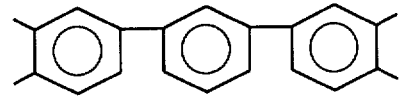

(In this formula, $R^1$ is at least one type of quadrivalent organic group selected from among the Chemical formulae 16, while $R^2$ is a bivalent organic group containing aromatic ring).

35 Claims, 9 Drawing Sheets

OTHER PUBLICATIONS

Journal of Vacuum Science and Technology, A, pp. 55–58, vol. 7, No. 1, (1989) "Interfacial reactions at copper surfaces coated with . . . ".

Journal of Vacuum Science and Technology, A, vol. 9, No. 6, pp. 2963–2974, (1991) "Oxygen induced adhesion degradation at metal/polyimide interface".

IEEE Transactions on Components, Hybrids, and Manufacturing Technology, vol. 3, No. 2 (1990) pp. 440–443 "A Pillar–Shaped Via Structure . . . ".

"Copper (1)" by N. De Zoubov, C. Vanleugenhaghe, and M. Pourbaix, Section 14.1, pp. 384–387 undated.

"Oxygen (1)" by N. De Zoubov and M. Pourbaix, Section 19.1, pp. 540–543 undated.

WIRING STRUCTURES AND METHOD OF MANUFACTURING THE SAME

BACKGROUND OF THE INVENTION AND RELATED ART STATEMENT

The present invention relates to the wiring structures having the thin film wiring provided with the wiring material mainly comprising copper and the insulating film mainly comprising polyimide, and the method of manufacturing the same; it relates particularly to highly integrated module board and the method of manufacturing the same.

In recent years, wiring structures such as wiring boards for mounting the LSI (large scale integrated circuit) are being made into multilayer structures featuring greater integration and higher performances. This tendency has required the insulator used in wiring structures to have more advanced characteristics. As one of the materials for this insulator, polyimide is used at present over an extensive range.

To get polyimide, diamine component and tetracarboxylic acid dianhydride component are polymerized in polar organic solvent to generate polyimide precursor (polyamic acid), which is heated for dehydration and ring closure. This method is generally used to obtain polyimide.

OBJECT AND SUMMARY OF THE INTENTION

As disclosed, for example, in Journal of Vacuum Science and Technology, A, P.1402, Vol. 7, No. 3 (1989) and Journal of Vacuum Science and Technology, A, P.55, Vol. 7, No. 1 (1989), however, the polyimide known so far has the problem that, if heated for said hydration and ring closure when brought in contact with copper, copper exudes into the polyimide (or polyimide precursor) to decompose polyimide at high temperature. To solve the problem of polyimide being decomposed by the copper exuding into the polyimide, the following method is known; heating is carried out at a high temperature of 300° C. or more in a reactive atmosphere using reductive gas such as argon/hydrogen mixture.

This method solves the issue of polyimide being decomposed at a high temperature, but fails to reduce the copper exuding into the polyimide (or polyimide precursor). Copper exuding into the polyimide (or polyimide precursor) causes the adhesion between copper and polyimide to be reduced, and increases the signal transmission delay time in order to raise dielectric constant. Furthermore, reductive gas is expensive, there is another problem of causing the product cost to be raised, when manufacturing the products by forming wirings in many layers repeatedly.

Esterification of the carboxyl group of the polyimide precursor (polyamide acid) can be considered as a method of solving the problem of copper exuding into the polyimide. Since esterified polyimide precursor is expensive, however, this may lead to higher product cost, especially when manufacturing the products by forming wirings in many layers repeatedly. Furthermore, acid chloride as esterified material is unstable to water, failing to ensure 100 percent esterification of the polyimide precursor, with carboxyl group remaining, though in small quantity. Furthermore, esterification of the polyimide precursor due to acid chloride results in generation of equimolar hydrochloric acid with the carboxyl group; it is not easy to remove it completely. That is, when the esterified polyimide precursor is used, the acid components of the carboxyl group and hydrochloric acid remain in the polyimide precursor solution, and this acid promotes metallic copper to exude. This makes it impossible to control the problem of copper exuding into the polyimide.

Another known method of reducing the copper exuding into the polyimide was to form polyimide after covering the copper exposed portion with different metal not exuding into the polyimide. This method, however, means increase of an process of forming a metal other than copper, resulting in higher production cost. Use of nickel or aluminum to cover the copper causes the metal covering the copper to diffuse with copper when heated, leading to increase in resistance of the wiring as a whole. A further diffusion of copper onto the surface of the coating metal will result in copper exuding into the polyimide.

When forming the thin film multilayer wiring of the circuit board such as multi-chip module, using copper as wiring and polyimide as insulator, the present inventors have encountered the problem of cracks occurring to the polyimide insulator by polishing it through mechanical means in order to achieve planarization on the insulator, in addition to the problems discussed above.

In an effort to solve these problems, the present inventors have reached the present invention as a result of continued studies in order to achieve:

(1) the primary object of providing the manufacture method to reduce the copper exuding into the polyimide or its precursor, without using esterified polyimide precursor or high-priced reductive gas during the heating and hardening of the polyimide precursor, that is, the manufacture method to reduce reaction between copper and polyimide precursor, and the wiring structures without exudation of copper, and (2) the second object of realizing the crack-free wiring structures which have excellent interfacial adhesion between the copper and polyimide while maintaining the polyimide mechanical characteristics, and are highly reliable as entire wiring board, as well as their low-cost manufacture method.

As discussed above, it is essential for the manufacture of the wiring structures to reduce reaction on the interface between said copper and polyimide precursor in the case of the polyimide where copper is used as part of the wiring and the insulator in direct contact with said copper is formed from the polyimide precursor by heating, and to reduce the insulator stress in the case of forming the via wiring for connection with the upper layer metallic layer.

Of the present inventions, the method of controlling the reaction between copper and polyimide precursor will be described in details below: The present invention provides wiring structures characterized in that, in the wiring structures equipped with the wiring layer and insulation layer, at least a part of the wiring of the above wring layer is composed of copper, and the insulation layer comprises the polyimide obtained by heating the polyimide precursor composition including the polyimide precursor provided with repetition units expressed in the following general formula (Chemical Formula 1):

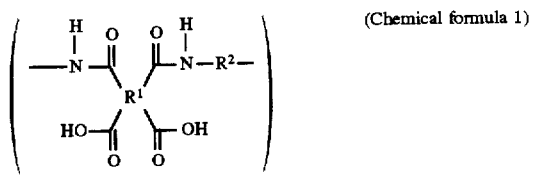
(Chemical formula 1)

Here $R^1$ is at least one type of quadrivalent organic group selected from among the following (Chemical formulae 2) and the following Chemical formula 14, while R2 is a bivalent organic group containing the aromatic ring.

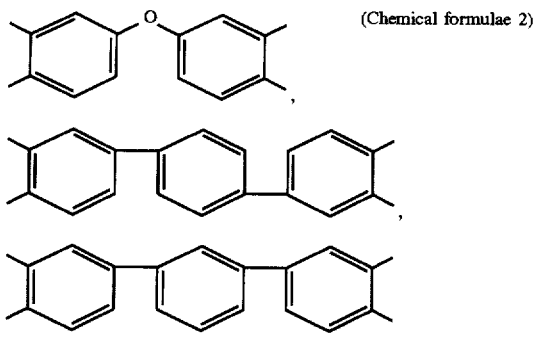
(Chemical formulae 2)
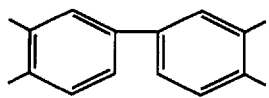
(Chemical formula 14)
This polyimide precursor has a low acidity, so use of this polyimide precursor reduces the copper exuding into the polyimide. $R^2$ is a bivalent organic group including aromatic ring; it is preferred to use at least one type selected from among the following Chemical formulae 3.
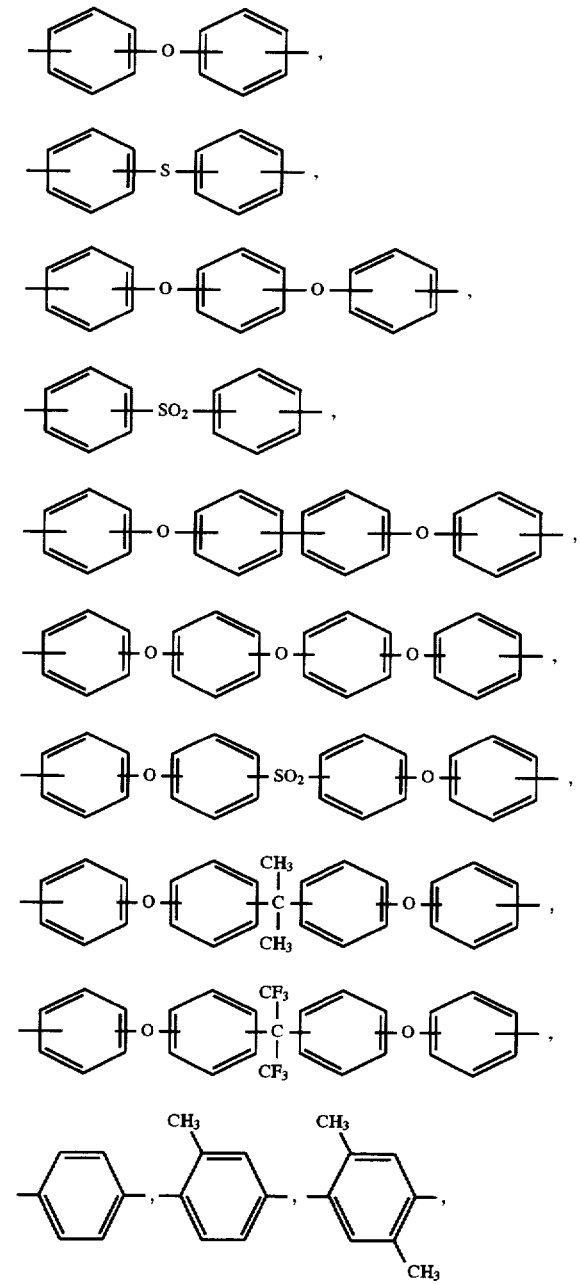
(Chemical formulae 3)

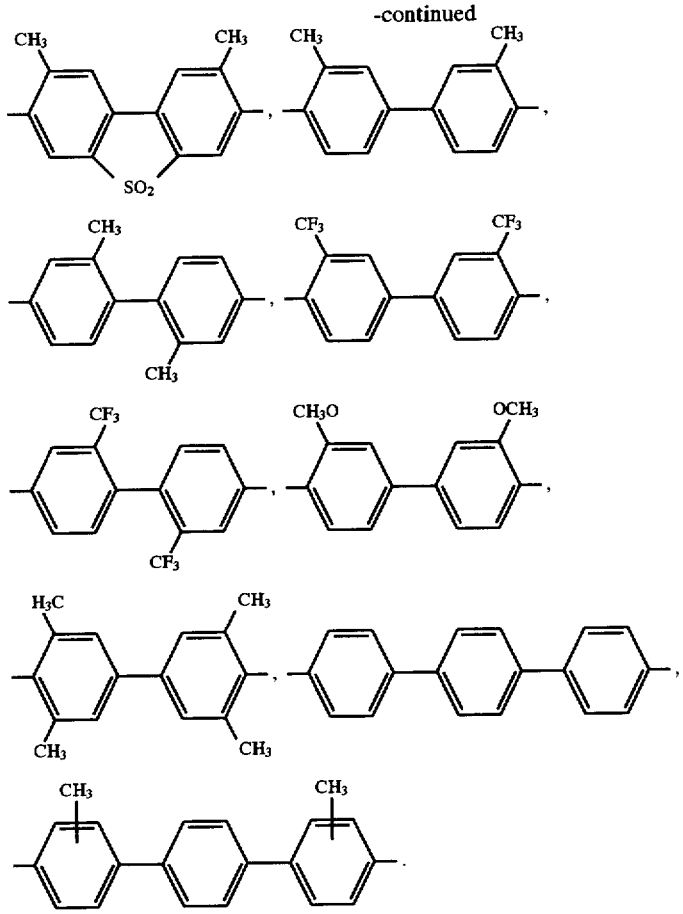

R² gives almost no influence to the acidity of the polyimide precursor in the general formula (Chemical formula 1), allowing free use of a group which gives excellent thermal and mechanical characteristics to the polyimide as cured material of the polyimide precursor.

Said polyimide precursor composition is preferred to contain further basic compound. As this basic compound, any basic compound can be used if it neutralizes the carboxyl group of the polyimide precursor and provides thermal curing of the polyimide precursor without much affecting the stability of the polyimide precursor, and if it does not damage the mechanical and electrical properties of the polyimide. This basic compound is preferred to be at least one type of the amine compound selected from among the following Chemical formulae 4:

(Chemical formulae 4)

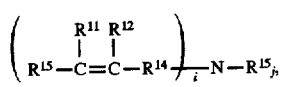

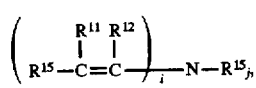

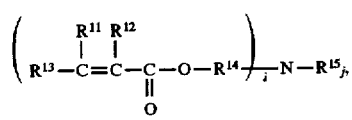

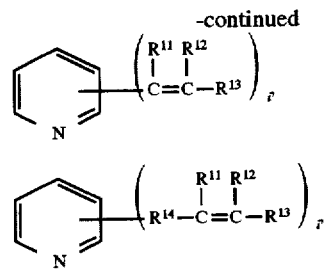

(Here $R^{11}$, $R^{12}$, and $R^{13}$ are groups selected from among the alkyl group, phenyl group and vinyl group with a hydrogen and carbon number 1 to 4, and $R^{14}$ is alkylene group, while $R^{15}$ is a group selected from among the alkyl group, phenyl group and vinyl group with a carbon number 1 to 4, and i+j=3 and i=1 to 3.)

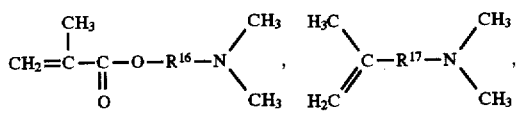

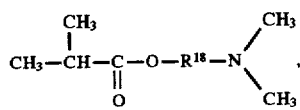

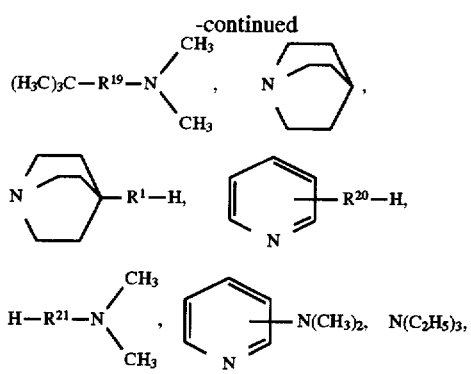

(Here each of $R^{16}$ to $R^{21}$ is at least one type of group selected from among the alkylene group and phenylene group with a carbon number 1 to 6.)

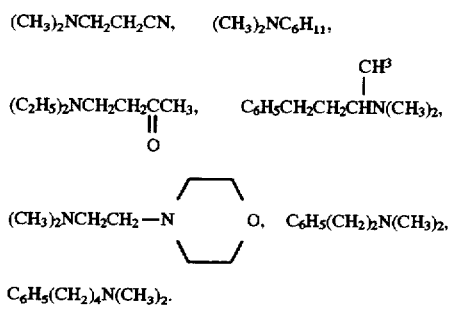

This basic compound neutralizes the carboxyl group of the polyimide precursor represented by said general formula (Chemical formula 1), so the acidity of the entire system is reduced, resulting in reducing reaction with copper. Furthermore, the amount of said basic compound should preferably be more than the amount to neutralize the carboxyl group of the polyimide precursor, but further more basic compound can be added if it does not much affecting the stability of the polyimide precursor. As will be discussed in details, such extra addition will work further to reduce the acidity of the system as a whole, and increasing the effect of reducing reaction with copper. Especially when the amine compound of said Chemical formula 4 is used as the basic compound, almost all of it will subjected to evaporation and resolution finally in formation of the polyimide through heating by polyimide precursor, and it hardly remains in the polyimide; excessive addition does not present any problem. Therefore, the amount of basic compound should preferably be more than one equivalent when that of the polyimide precursor is one equivalent. The polyimide equivalent is the value calculated by assuming one carboxyl group as one value. The equivalent of the basic compound is a value calculated by assuming that one site serving as a reaction point is one value, when the acid base interaction with acid is taken into account.

The following describes how to prevent cracks from occurring on the insulator. The present invention provides wiring structures characterized in that, in the wiring structures provided with the wiring layer and insulation layer, at least a part of the wiring of the above wring layer is composed of copper, and the insulation layer comprises at least the first insulator formed on the wiring layer and the second insulator formed on said first insulator, where the first insulator comprises the first polyimide obtained from the said polyimide precursor, and the second insulator comprises the second polyimide having a smaller thermal expansion coefficient than said first polyimide. Said first insulator is preferred to be less thick than the said second insulator. It works to reduce reaction between the said copper and polyimide, and the thickness is preferred to be 6.5 μm or less.

Use of polyimide having a lower thermal expansion coefficient is intended to prevent cracks from occurring to the polyimide film. A case of causing cracks will be described with reference to FIG. 8.

For example, as shown in FIG. 8a, via wiring 3 is formed in order to ensure that wiring 2 formed in parallel to substrate 1 is connected to the upper layer, and polyimide 4 is formed as insulator, as shown in FIG. 8b. As shown in FIG. 8c, the polyimide 4 is polished for planarization of the insulator, and the head of a via wiring 3 is pulled out; then cracks occur around the via wiring 3. An attempt to form another wiring on it may cause the wiring to be broken and faulty. Cracks are caused by the stress due to the difference of thermal expansion coefficient between the substrate and polyimide or between the substrate and metal. Use of polyimide having a thermal expansion coefficient is required to reduce the stress acting on this polyimide film. This will result in reduction of stress, preventing cracks from occurring. The stress in this case is preferred to be 35 MPa (mega-Pascal) or less as the entire insulator. To achieve this low stress, the percentage of the film thickness of said low thermal expansion polyimide having in the entire insulator is required to be 50 percent or more. This is because it is often the case that the stress of the non-low thermal expansion polyimide film is about 45 MPa, while the stress of the low thermal expansion polyimide film is 25 MPa or less, and additivity holds approximately to the stress of the composite film comprising their lamination.

Low thermal expansion polyimide to achieve such low stress is preferred to have an excellent adhesion with the metallic layer and polyimide formed on the upper layer.

For example, as the first example of the second polyimide, it is possible to mention the polyimide obtained by heating the polyimide precursor composition containing the second polyimide precursor, wherein the structure represented in the following general formula (Chemical formula 5) and (Chemical formula 6) is provided as a repeating unit, the number of the repeating units represented in the general formula (Chemical formula 5) is below 95, and that of the repeating units represented in the general formula (Chemical formula 6) is 5 or more, when 100 is assumed as the total of the number of the repeating units included in one molecule represented in the general formula (Chemical formula 5) and that of the repeating units represented in the general formula (Chemical formula 6).

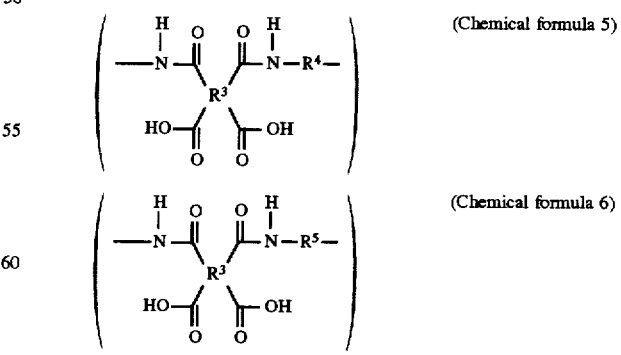

(In the formulae, $R^3$ is at least one type of quadrivalent organic group selected from among (Chemical formulae 7), and $R^4$ is at least one type of bivalent organic group selected from among the following (Chemical formulae 8), while $R^5$ is a bivalent organic group selected from the following (Chemical formulae 9)).

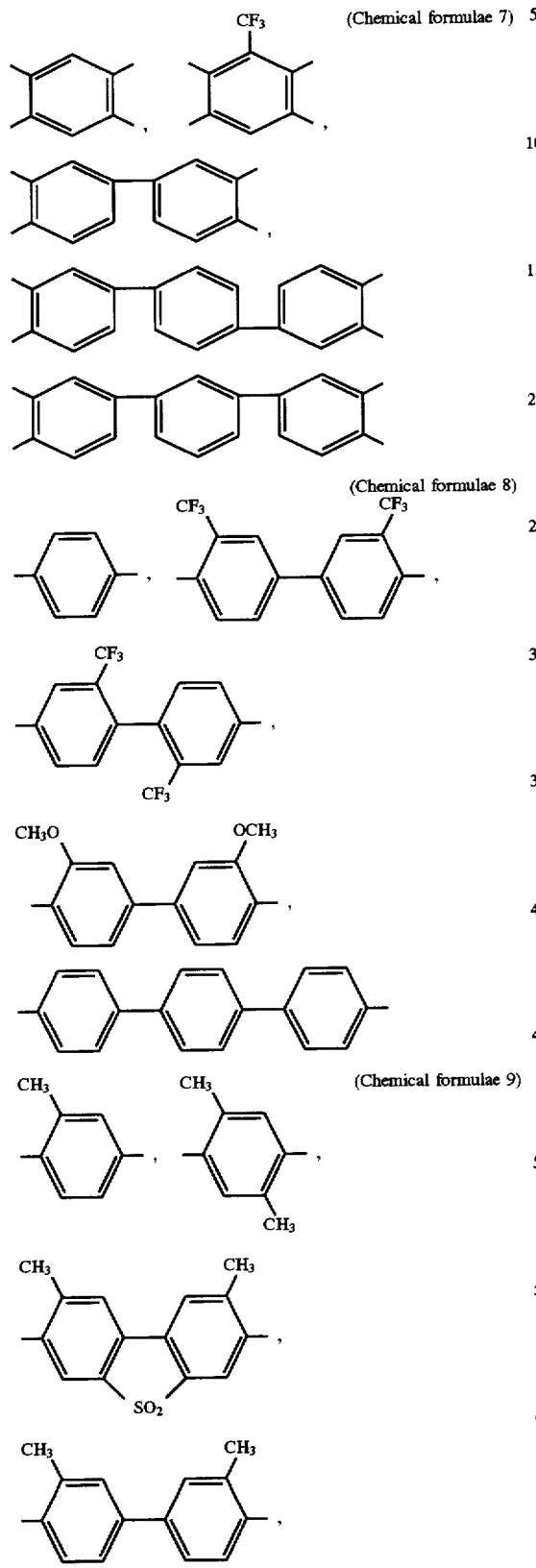

As the second example of the second polyimide, it is possible to mention the polyimide obtained by heating the polyimide precursor composition containing the second polyimide precursor, wherein the structure represented in the following general formula (Chemical formula 10) and (Chemical formula 11) is provided as a repeating unit, the number of the repeating units represented in the general formula (Chemical formula 10) is 85 to 50, and that of the repeating units represented in the general formula (Chemical formula 11) is 50 to 15, when 100 is assumed as the total of the number of the repeating units included in one molecule represented in the general formula (Chemical formula 10) and that of the repeating units represented in the general formula (Chemical formula 11).

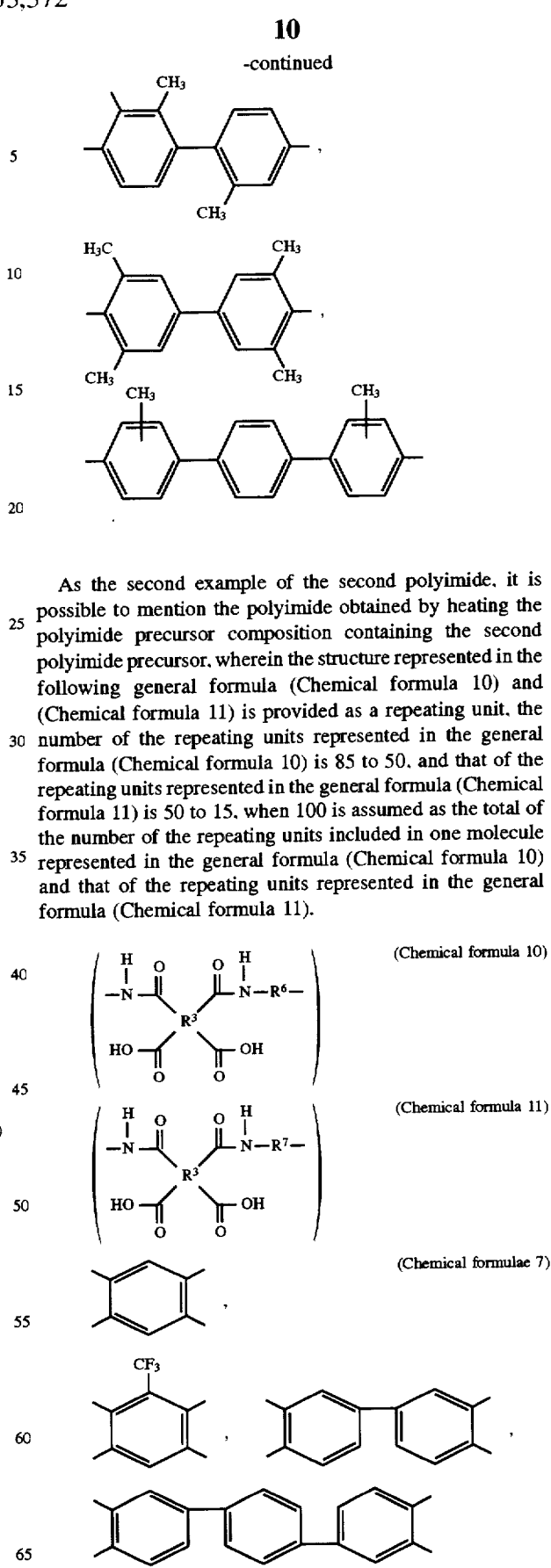

-continued

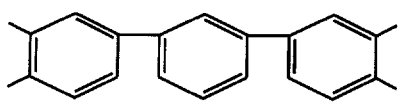

(In the formulae, $R^3$ is at least one type of quadrivalent organic group selected from among (Chemical formulae 7), and $R^6$ is at least one type of bivalent organic group selected from among the following (Chemical formulae 12), while $R^7$ is a bivalent organic group selected from among the following (Chemical formulae 13)).

(Chemical formulae 12)

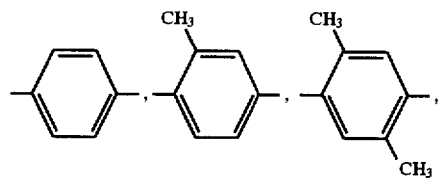

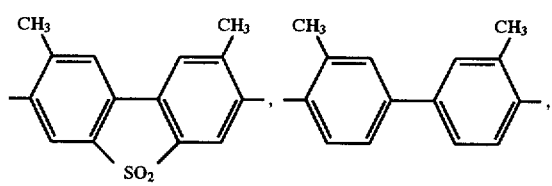

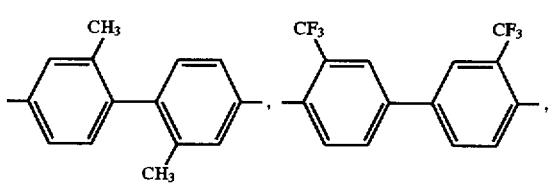

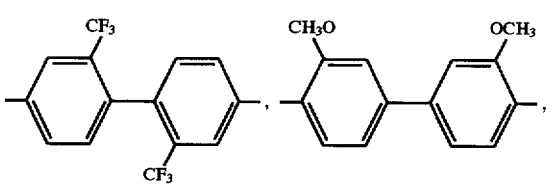

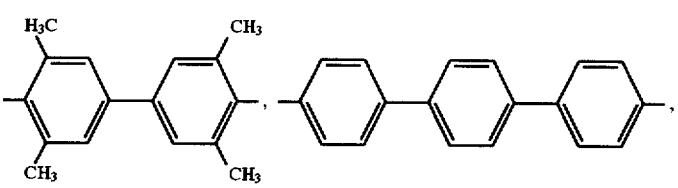

(Chemical formulae 13)

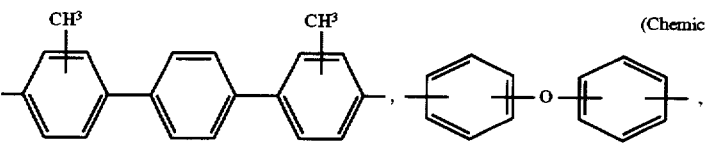

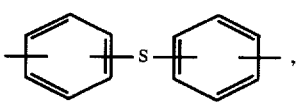

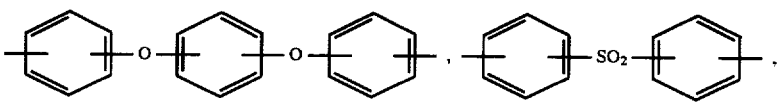

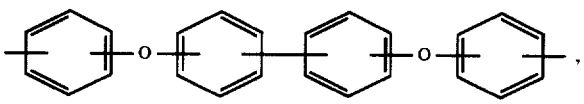

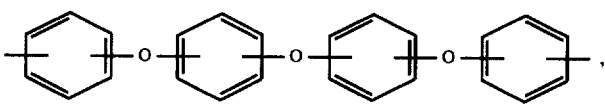

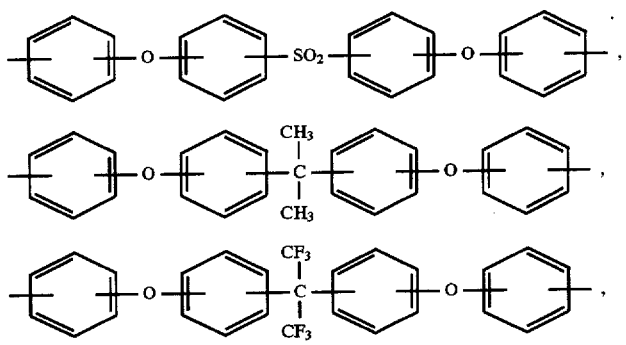

Of said two examples cases of low thermal expansion polyimide, the first example ensures adhesion with the polyimide formed on the upper metal and upper layer by introducing into the polyimide molecular chain the polyimide provided with methyl group in aromatic ring. This is because the organic group having methyl group in the aromatic ring creates an extremely active surface state by ashing with oxygen or sputtering with argon ion, resulting in ensuring said adhesion. Its percentage is required to be 5% or more, and a sufficient effect can be achieved. Furthermore, the second example ensures adhesion with the metal and polyimide formed on the upper layer by introducing into the polyimide molecular chain the organic group compound having ether linkage. The organic group compound having ether linkage originally has excellent adhesion with the upper metal and polyimide formed on the upper layer, whereas it is an inhibiting factor since it becomes low thermal expansion polyimide. Thus, low stress and high adhesion mentioned above can be achieved within a limited range described above.

All the said polyimide precursor can be easily obtained by agitating the required tetracarboxylic acid dianhydride and diamine component in polar organic solvent and by generating the polyimide precursor (polyamide acid) by polymerization, where the volume of tetracarboxylic acid dianhydride and that of diamine are preferred to be almost equal to each other stoichiometrically.

Available polar organic solvent includes 1-methyl-2-pyrrolidone, N, N-dimethylacetamide, N, N-dimethylformaldehyde, dimethylsulfoxide, hexamethylphosphoramide, tetramethylenesulfon, para-chlorophenol and para-bromophenol; at least one of them can be used, but the use is not restricted to them. Any thing can be used so long as it allows polyimide precursor to resolve.

The polyimide precursor composition containing the basic compound can be obtained by adding basic compound into the reaction solvent obtained and agitating it after synthesizing the said polyimide precursor according to the said procedure.

The present invention provides the method of manufacturing said wiring structures. In the polyimide firing process, oxygen concentration is preferred to be 0.05% or less in the atmosphere. In the method of manufacturing the wiring structures, oxygen gives a great impact in the process of copper exuding into the polyimide precursor, as will be described in details in the description of Operation of the Invention and Embodiments. Reduction of this oxygen concentration reduces copper exuding into the polyimide precursor. Oxygen concentration in the range of 0.5% or less is especially effective in this function; the volume of the exuding copper shows a sudden increase over this range.

As a means for this end, nitrogen gas generating from normal liquefied nitrogen can be used as atmosphere for baking as the atmosphere at the time of baking after application of polyimide precursor, and the atmosphere with a low oxygen concentration of 100 ppm or less can be easily achieved. As will be discussed later, reduction of this oxygen concentration and reduction in acidity of the solution system including the said polyimide precursor allow additivity to be established regarding the effect of preventing copper from exuding into the polyimide precursor.

Accordingly, copper exuding into the polyimide precursor can be minimized by reduction of oxygen concentration in the atmosphere in which the copper and polyimide precursor are brought into contact, and by reduction in acidity of the polyimide precursor to be used.

The following describes the operation of the means used to solve two problems in the present invention; (1) suppression of the reaction between copper and the polyimide precursor and (2) prevention of cracks from occurring to the polyimide film in the production of wiring structures.

(1) Suppression of the reaction between copper and the polyimide precursor

The following describes the operation in details regarding the method of achieving the first object, suppression of the reaction between copper and the polyimide precursor:

Copper exuding into the polyimide or polyimide precursor is considered to be caused by reaction between copper and polyimide precursor. Reaction between copper and polyimide precursor is the ionization reaction of the metallic copper due to acid dissociated from the carboxylic acid present in the polyimide precursor; it is the oxidation-reduction reaction represented by any one of the following reaction formula 1 and reaction formula 2:

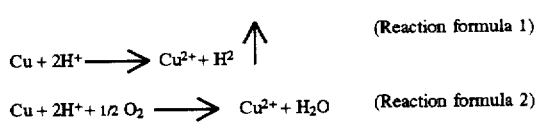

The standard potential E of these oxidation-reduction reactions is −0.68 V in the case of the reaction expressed by Reaction formula 1, and is +1.78 V in the case of the reaction expressed by Reaction formula 2. Standard potential E represents the difference of potentials between the right and left sides in the so-called Nernst's formula when copper on the left side and copper-ion on the right side have equal activity. Generally, when this value is positive, reaction proceeds to the right spontaneously; when it is negative, reaction does not easily proceed to the right.

Reaction according to the Reaction 1 does not proceed spontaneously since the standard potential is negative. Reaction according to Reaction 2 proceeds spontaneously since the standard potential is positive. Therefore, reaction between copper and polyimide is considered not to be the form of Reaction formula 1 which is ionization of copper by acid and its accompanying hydrogen generation, but to be water generation reaction (Reaction formula 2) participated in by three factors; acid, copper and oxygen.

The following describes the further detailed studies on Nernst's formula regarding said reaction. Standard potential E according to said Reaction formula 2 represents the difference of potentials on the right and left when copper on the left and copper ion on the right have the same activity, that is, when about one half the copper on the left has reacted to become copper ion, in approximate terms. To discuss the reaction on a quantitative basis, it is necessary to use the following (Mathematical formula 1) ("Atlas of Electrochemical Equibria in Aqueous Solution", 1966, Pergamon Press Ltd., P. 386 and P. 541), which takes into account the partial pressure of oxygen, hydrogen ion concentration and copper ion activity.

$$E=1.78-0.12 \text{ pH}+0.03 \log (pO_2)-0.06 \log [Cu^{2+}]$$ (Mathematical formula 1)

The left side E of this formula represents the difference of the potentials before and after Reaction formula 2; that is, it shows the difference in potential energies. Oxygen concentration and hydrogen ion concentration are represented in oxygen partial pressure ($pO_2$) and hydrogen ion index (pH), respectively on the right. Reaction is more difficult to proceed as the value E is smaller.

By way of an example, the following discusses the case where polyimide is esterified. In this case, if esterification rate is 100 percent, pH is considered to be neutral in approximate terms, but E is not equal to 0 when pH=7; it can be seen that reaction according to Reaction formula 2 can still proceed even when polyimide precursor is esterified.

Let us consider the oxygen concentration: Since $pO_2$ is 1 or less, the term containing $O_2$ is negative as a whole. The value E is smaller as oxygen concentration is lower; thus, reaction according to Reaction formula 2 is considered to become difficult to proceed.

Based on the above discussion, two means can be considered to reduce reaction between copper and polyimide precursor; reduction of the acidity of the system (to increase the pH value) and reduction of the oxygen concentration of the system.

Above assumption has been derived from the difference in potential energies before and after the reaction according to the theory of chemical equilibrium. It is not considered from the viewpoint of reaction kinetics, and the numerical values and coefficients represented in Mathematical formula 1 are based on ideal conditions; thus, actual effects must be proven in experiments. As will be demonstrated in the Embodiments, the inventors of the present invention have demonstrated it in many experiments, and have confirmed remarkable effects in reducing reaction between copper and polyimide precursor; this has have lead to the present invention. Of said two means, the means of reducing the system acidity is adopted in the present invention. In the present invention, weakly acidic polyimide precursor uses the polyimide precursor expressed by the following general formula (Chemical formula 1):

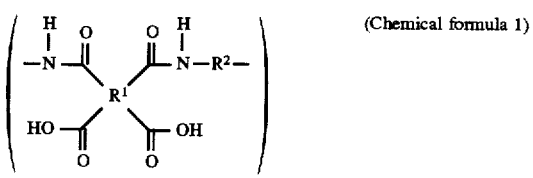
(Chemical formula 1)

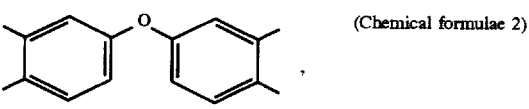
(Chemical formulae 2)

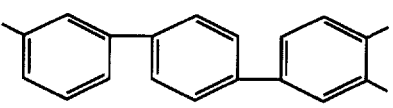

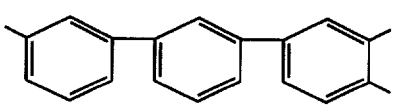

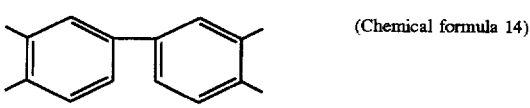
(Chemical formula 14)

(In the formula 1, $R^1$ is at least one type of quadrivalent organic group selected from among the (Chemical formulae 2) and (Chemical formula 15), and $R^2$ is a bivalent organic group including the aromatic ring.)

The acidity of the polyimide precursor according to general formula (Chemical formula 1) depends on the degree of dissociation of the hydrogen ion from carboxylic group. The degree of dissociation depends on the structure of $R^1$; it is determined by what other substituents are bonded to the aromatic ring to which one carboxylic group is bonded.

This is known as Hammett rule which is an empirical rule. Table 1 shows the σ-value representing the degree of dissociation in Hammett rule, obtained from calculation for some $R^1$s.

Table 1 σ-value according to Hammett rule

TABLE 1

σ-value according to Hammett rule

| $R^1$ | Abbreviation of corresponding dianhydride | σ-value according to Hammett rule |
|---|---|---|
| 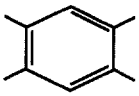 | PMDA | 0.82 |

TABLE 1-continued

σ-value according to Hammett rule

| R¹ | Abbreviation of corresponding dianhydride | σ-value according to Hammett rule |
|---|---|---|
| (benzophenone structure) | BTDA | 0.36 |
| (biphenyl structure) | BPDA | −0.01 |
| (p-terphenyl structure) | TPDA | −0.01 |
| (m-terphenyl structure) | m-TPDA | −0.01 |
| (diphenyl ether structure) | ODPA | −0.32 |

The following shows the abbreviations used in Table 1:
PMDA: Pyromellitic dianhydride
BTDA: 3, 4, 3', 4'-benzophenotetracarboxylic dianhydride
BPDA: 3, 3', 4, 4'-biphenyltetracarboxylic dianhydride
TPDA: p-terphenyl-3, 3", 4, 4"-tetracarboxylic dianhydride
m-TPDA: m-terphenyl-3, 3", 4, 4"-tetracarboxylic dianhydride
ODPA: 3, 3', 4, 4'-oxydiphthalic dianhydride As is clear from Table 1, σ-value is positive with great acidity in the case of PMDA and BTDA generally used, while σ-value is 0 or less with small acidity in the case of BPDA, ODPA and TPDA. It can bee seen that this reduces copper from exuding since the polyimide precursor has a low acidity when said R¹ is in accordance with (Chemical formulae 2).

Said R² is not directly linked with aromatic ring of R¹, giving almost no impact to the acidity of the polyimide precursor. Since Hammett rule is an empirical rule applicable in aqueous solution, actual effects must be proven in experiments when it is directly applied to organic solvent system. As will be demonstrated in the Embodiments, the inventors of the present invention have confirmed that compounds showed in (Chemical formula 1) according to the present invention are effective not only in aqueous solution but also in organic solvent system which is within the scope of the present invention.

The basic compound used in the present invention has the effect of neutralizing the carboxylic group in the polyimide precursor, and reducing the acidity of the entire solution including the polyimide precursor, thereby raising pH value. As a result, presence of the basic compound reduces the potential of the reaction on the left side of said Mathematical formula 1, working to reduce reaction. Furthermore, basic compound further raises the pH value of the system, if it is added in such an excessive quantity that it will more than neutralize carboxylic group, thereby reducing reaction between copper and polyimide precursor further. Thus, polyimide precursor composition used in the formation of insulation layer is preferred to contain one equivalent or more of said basic compound for one equivalent of contained polyimide precursor. That is, polyimide precursor composition is preferred to contain the basic compound in such a quantity that that the number of reaction points will be greater than the total number of the carboxylic groups contained in the said entire polyimide precursor.

As discussed above, reduction in the oxygen concentration in the system is effective for reduction of exuding copper. When polyimide is heated, oxygen concentration in the atmosphere is preferred to be kept to 0.5 percent by volume. Reduction of oxygen concentration of the system to 0.5 percent by volume has the effect of further prevention of exuding copper, in addition to the effect of using weakly acidic polyimide.

(2) Prevention of cracks from occurring to polyimide film in the production of wiring structures The following describes the means from the viewpoint of preventing cracks:

As discussed already, when the wiring structure of the present invention is manufactured using the normal polyimide cracks may occur to the polyimide film. The present inventors have found out that cracks can be prevented by reducing the film stress working on the polyimide film. Making reference to FIGS. 8a, 8b and 8c, the following discusses the reasons why cracks can be prevented by reducing the film stress:

As illustrated in FIG. 8c, cracks may occur around the via wiring 3 when polyimide film 4 is polished to obtain the flat insulation film 4 with exposed top of via wiring 3. This is because stress is produced between substrate 1 and polyimide 3 by the difference of thermal expansion coefficients. This stress does not present problem before polishing the polyimide film 4 (shown in FIG. 8b), since polyimide film 4a on via wiring 3 serves as connection. However, since this connection is removed after polishing, film stress works to tear off the polyimide around the via wiring, and cracks are considered to be caused by this force. The force to tear off polyimide film 4 cannot be removed by changing the via wiring from rectangular form to round form; fundamental solution to the problem can be achieved only by reducing the film stress itself.

To reduce film stress, the present invention forms the insulation layer to be made of at least two layers; the first insulation film comprising the polyimide with poor reaction with copper and the second insulation film comprising the low thermal expansion polyimide. The first insulation film is formed on the wiring layer, and the second insulation film is formed further on the first layer, thereby forming one polyimide insulation layer as a whole. This reduces the thermal stress applied to the polyimide layer in direct contact with the wiring, according to the present invention.

As low thermal expansion polyimide, it is possible to use the polyimide obtained by heating the polyimide precursor composition containing the polyimide precursor having as repeating unit the structure represented by the general formulae ((Chemical formula 5) and (Chemical formula 6). It should be noted, however, that when the total between the number of the repeating units represented by the general formula (Chemical formula 5) included in one of the molecules of this polyimide precursor and the number of the repeating units represented by the general formula (Chemical formula 6) is assumed to be 100, the number of the repeating units represented by the general formula (Chemical formula 5) is below 95, and that represented by the general formula (Chemical formula 6) is 5 or more.

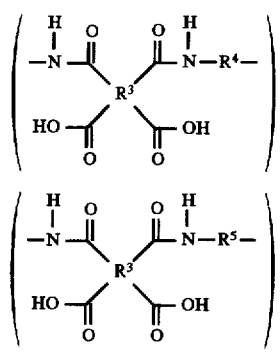

(Chemical formula 5)

(Chemical formula 6)

(In the formulae, R³ is at least one type of quadrivalent organic group selected from among the (Chemical formulae 7), R⁴ is at least one type of bivalent organic group selected from among the (Chemical formulae 8), and R⁵ is at least one type of bivalent organic group selected from among the (Chemical formulae 9).

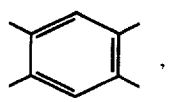

(Chemical formulae 7)

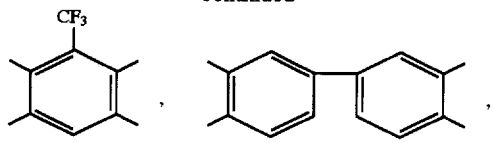

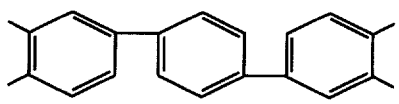

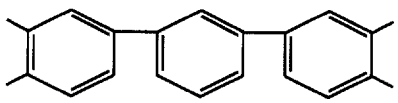

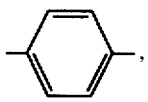

(Chemical formulae 8)

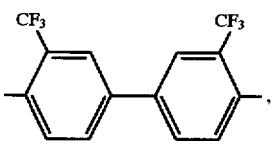

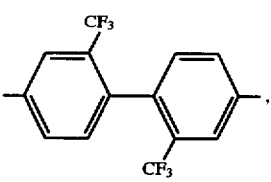

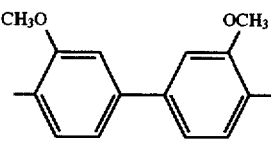

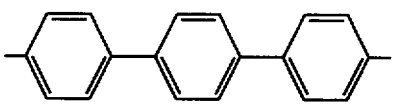

(Chemical formulae 9)

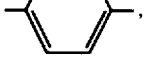

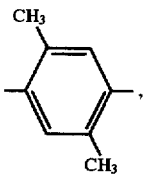

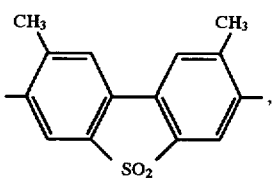

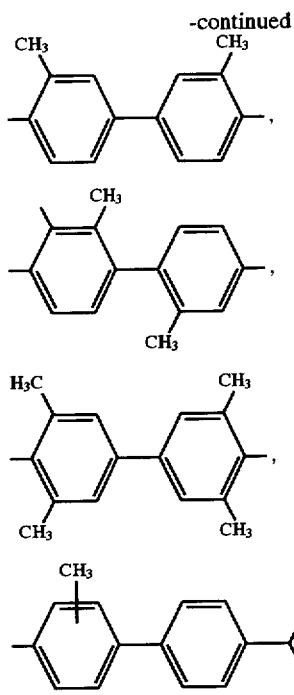

Furthermore, as low thermal expansion polyimide, it is also possible to use the polyimide precursor obtained by heating polyimide precursor composition including the polyimide precursor having as the repeating unit the structure expressed in the following general formulae (Chemical formula 10) and (Chemical formula 11).

It should be noted, however, that when the total between the number of the repeating units represented by the general formula (Chemical formula 10) included in one of the molecules of this polyimide precursor and the number of the repeating units represented by the general formula (Chemical formula 11) is assumed to be 100, the number of the repeating units represented by the general formula (Chemical formula 10) is 85 to 50, and that represented by the general formula (Chemical formula 11) is 50 to 15.

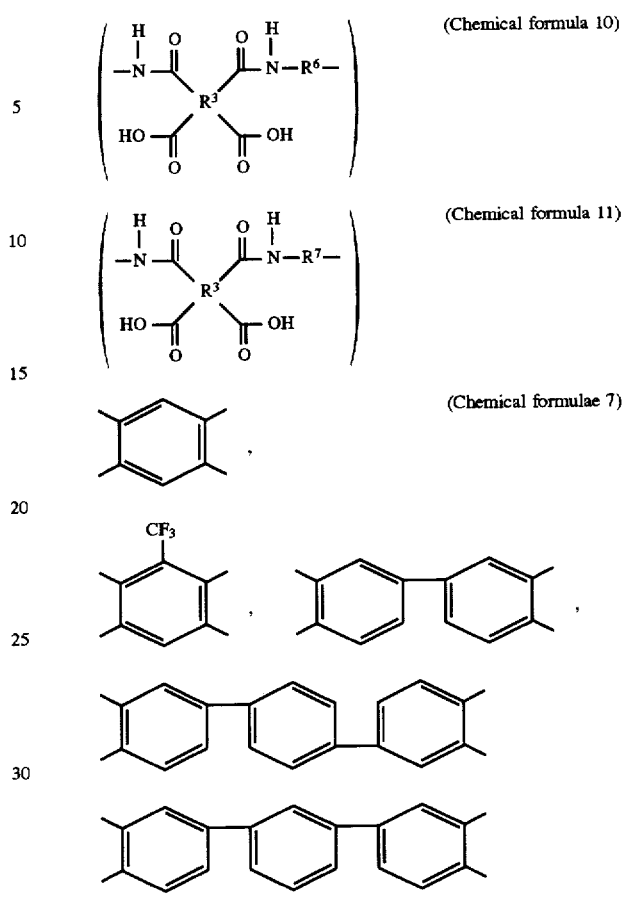

(In the formulae, $R^3$ is at least one type of quadrivalent organic group selected from among the (Chemical formulae 7), and $R^6$ is at least one type of bivalent organic group selected from the following Chemical formulae 12), while $R^7$ is a bivalent organic group selected from among the the following (Chemical formulae 13).

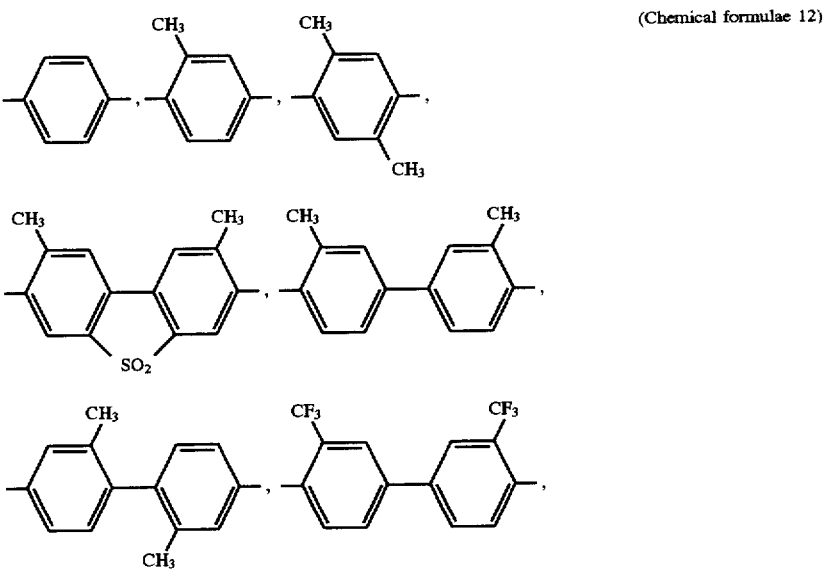

(Chemical formulae 12)

-continued

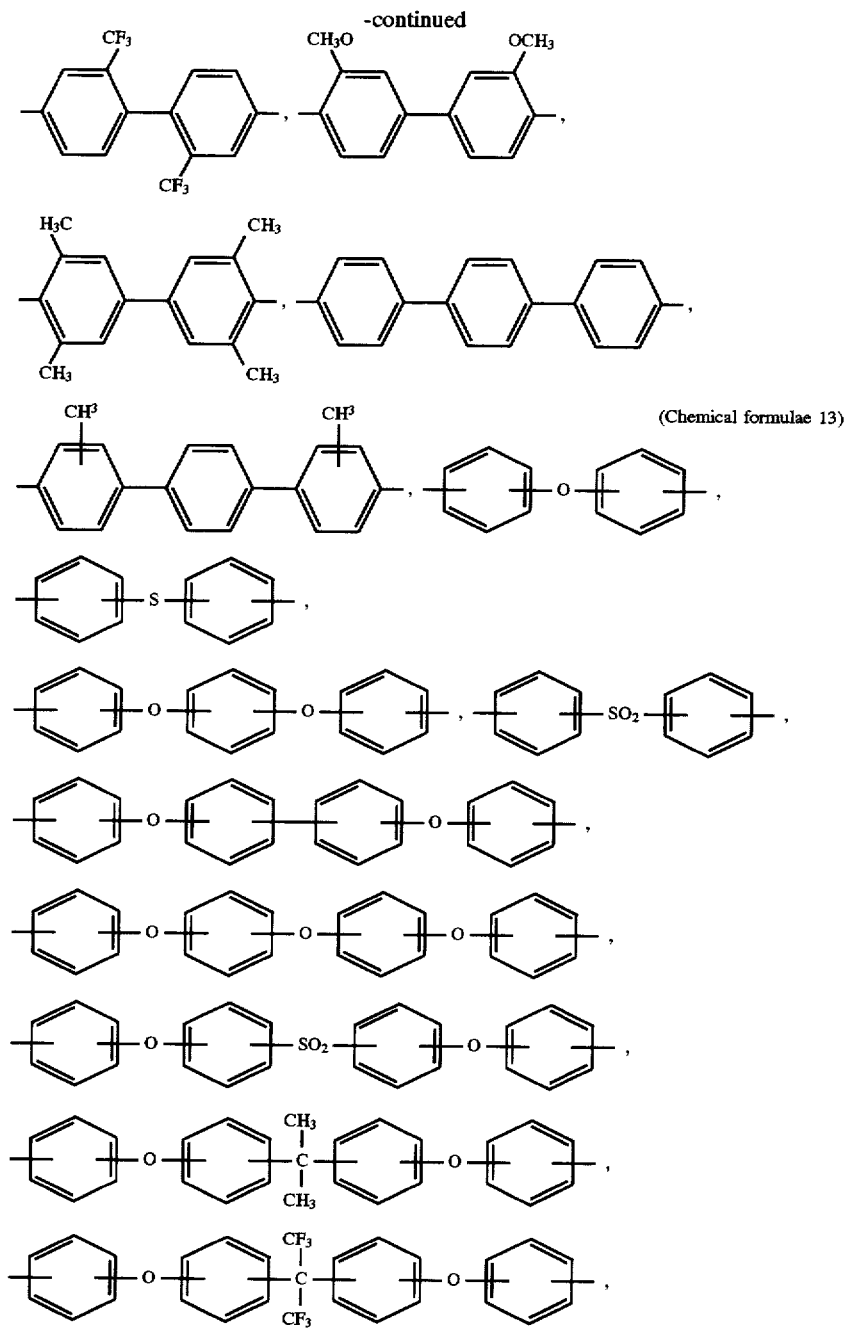

(Chemical formulae 13)

These polyimides feature low thermal expansion, with a thermal expansion coefficient is 4 to $18\times10^{-6}$/K. When the silicon wafer (crystal surface 1, 0, 0) is used as a substrate, film stress is as low as 3 to 25 MPa, and is suited to the present invention. It should be noted, however, that the second insulation film is not restricted to one-layer film comprising one type of polyimide. It may be the multiple layer comprising more than one polyimide films selected from among said polyimides.

DETAILED DESCRIPTION OF PREFERRED EMBODIMENTS

Figure 1A:
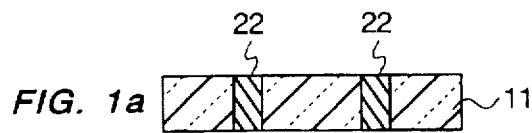
FIGS. 1a, 1b, 1c, 1d, 1e, 1f, 1g, 1h, 1i, 1j, 1k and 1l are sectional views illustrating the copper polyimide multilayer wiring structure manufacturing process in Embodiment 6.

The following describes the preferred embodiments of the present invention with reference to Figures to provide detailed explanation.

The following illustrates the symbols and numerals used in the drawings:

1 ... Substrate, 2 ... Wiring, 3 ... Via wiring, 4 ... Polyimide, 11 ... Ceramic substrate, 12 ... Electrode layer, 13 ... Photoresist, 14 ... Copper wiring, 14a . . . Via wiring, 15 ... Polyimide film, 16 ... 1st insulation film, 17 ... 2nd insulation film, 22 ... Tungsten wiring, 25 ... Surface electrode, 26 ... Protective film, 27 ... Opening, 28 ... Chromium, 29 ... Conductor layer mainly comprising the copper 30 ... Via hole, 31 ... Via wiring, 32 ... Insulation film In the examples of the synthesis described below, the E-type viscosimeter (DVO-E digital viscosimeter (by Tokimek Co., Ltd.)) was used for the measurement of viscosity.

Polyimide precursor was synthesized to obtain the polyimide precursor composition as the varnish where reaction solvent remained (Examples of Synthesis 1–10 and 14–15). Table 2 shows the viscosity of the varnish obtained.

PDA: p-phenylnediamine
DMBP: 3, 3'-dimethyl-4, 4'-diaminobiphenyl
DAPM: 3-dimethylaminopropylmethacrylate 4-MPY: 4-methylpyridine (EXAMPLE OF SYNTHESIS 1)

30.0 g of 4, 4'-diaminediphenylether as diamine component was agitated and resolved in 420 g of mixed solution between N,N-dimethylacetamide (DMAc) and 1-methyl-2-pyrrolidone (NMP) at one-to-one ratio, at the room temperature under nitrogen gas flow. Then 44.1 g of 3, 3', 4, 4'-biphenyltetracarboxylic dianhydride was added as dianhydride component, to be agitated and resolved. Six hours after addition of dianhydride (solid component concentration: 15 weight percent), viscosity of polyimide precursor (polyamic acid varnish) solution reached 600 Poises. Furthermore, this solution was heated for about 6 hours within the temperature range from 55° to 70° C. so that the viscosity was 30 Poises, thereby obtaining the polyimide precursor composition (varnish No. 1) to be used in the production of wiring structures.

(EXAMPLE OF SYNTHESIS 2)

51.4 g of 3-dimethylaminopropylmethacrylate was added as basic compound to the polyimide precursor composition obtained in the Example of Synthesis 1. After the addition, the viscosity of the solution rose to 55 Poises. Then said solution was heated at 35° C. for four hours to get the viscosity of 40 Poses, thereby obtaining the polyimide precursor composition (varnish No. 2) to be used in the production of wiring structures.

TABLE 2

| | Polyimide precursor | | | | |
|---|---|---|---|---|---|
| Varnish No. | Dianhydride composition | Diamine component | Basic compound | Concentration of solid | Viscosity (Poise) |
| 1 | BPDA | DDE | Absent | 15 | 30 |
| 2 | BPDA | DDE | DAPM | 15 | 40 |
| 3 | BPDA | DDE | 4-MPY | 15 | 40 |
| 4 | BPDA | BAPB | Absent | 15 | 40 |
| 5 | BPDA | HFBAPP | Absent | 18 | 45 |
| 6 | ODPA | DDE | Absent | 17 | 50 |
| 7 | TPDA | DDE | Absent | 17 | 50 |
| 8 | TPDA | BAPP | Absent | 15 | 35 |
| 9 | BPDA | PDA:DMBP = 2:1 (mole ratio) | Absent | 15 | 45 |
| 10 | BPDA | PDA:DDE = 4:1 (mole ratio) | Absent | 15 | 110 |
| 14 | m-TPDA | DDE | Absent | 17 | 50 |
| 15 | m-TPDA | BAPP | Absent | 15 | 35 |

The following describes the names of the compounds denoted by the their abbreviations used in Table 2.
BPDA: 3, 3', 4, 4'-biphenyltetracarboxylic dianhydride
ODPA: 3, 3', 4, 4'-oxydiphthalic dianhydride
TPDA: p-terphenyl-3, 3", 4, 4"-tetracarboxylic dianhydride
m-TPDA: m-terphenyl-3, 3", 4, 4"-tetracarboxylic dianhydride
DDE: 4, 4'-diaminodiphenylether
BAPB: 4, 4'-bis(4-aminophenoxy)biphenyl
BAPP: 2, 2-bis [4-(4-aminophenoxy)phenyl] propane
HFBAPP: 2, 2-bis [4-(4-aminophenoxy)phenyl] hexafluoropropane (EXAMPLES OF SYNTHESIS 3 TO 10 AND 14 to 15)

Using the components shown in the column of Varnish No. 3 to 10 and 14 to 15 in Table 2, the present inventors synthesized the polyimide precursor in the same way as those of the Example of Synthesis 1 and Example of Synthesis 2 to obtain the polyimide precursor composition (Varnish 3 to 10 and 14 to 15). Table 2 shows the solid concentration and viscosity for this case.

(EXAMPLE OF SYNTHESIS BY COMPARISON)

Using the material shown in Table 3, the inventors of the present invention synthesized polyimide precursor in the same way as Example of Synthesis 1, to get the polyimide precursor composition (Varnish No. 11 to 13).

TABLE 3

| | Polyimide precursor | | | |
|---|---|---|---|---|
| Varnish No. | Dianhydride composition | Diamine component | Concentration of solid (wt %) | Viscosity (Poise) |
| 11 | PDMA | DDE | 15 | 30 |
| 12 | BTDA | DDE | 15 | 35 |
| 13 | PMDA:BTDA = 1:1 (mole ratio) | DDE | 15 | 15 |

The following describes the names of the compounds denoted by their abbreviations used in Table 3.

PMDA: Pyromellitic dianhydride

BTDA: 3, 4, 3', 4'-benzophenotetracarboxylic dianhydride (Embodiment 1)

30 g of No. 1 polyimide precursor varnish in Table 2 (synthesized in Example of Synthesis 1) was put into a 200 ml-volume flask with round bottom, and atomized copper (having a particle diameter of 15 μm and purity of 99.999%) was added to it. It was agitated at the speed of 300 rpm under nitrogen gas flow for 30 minutes. Agitation was made at three different temperatures; 23°, 50° and 80° C. Oxygen concentration inside the flask at this time was measured by an oxygen concentration meter to get the value of about 500 ppm.

This was followed by filtering of the varnish with pressure supplied by nitrogen, using the filter having a pore size of 3 μm, and the un-reacted copper was completely removed from the varnish. The filtered varnish was coated on the glass substrate by spinning, and was prebaked at 130° C. for 30 minutes under nitrogen gas flow. Then the generated polyimide precursor filter was peeled off from said varnish.

Figure 2:
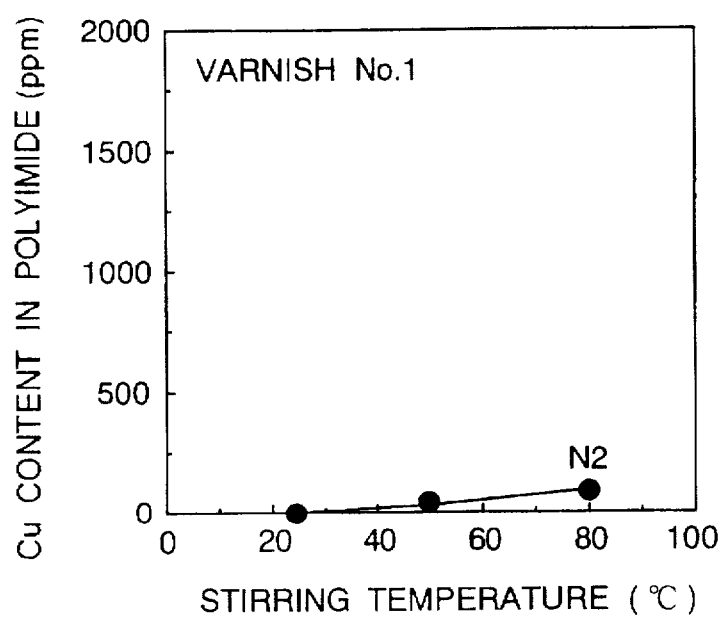
FIG. 2 is a graph representing the reaction between copper and polyimide precursor in Embodiment 1.

The film was mounted on the frame and was baked at 200° C. under nitrogen gas flow for 30 minutes, and furthermore baked at 350° C. for 30 minutes, thereby getting the polyimide film with copper uniformly distributed. The concentration of the copper present in this film was determined by fluoroscopy. FIG. 2 shows this result. It represents the amount of copper exuded into the varnish by reaction between the copper and the varnish as polyimide precursor. As illustrated in the drawing, almost no copper exuded into the varnish despite temperature rise. It has been revealed that use of weakly acidic polyimide precursor and atmosphere of low oxygen concentration are very effective for suppression of reaction between copper and polyimide precursor.

(Embodiment 2)

Figure 3:
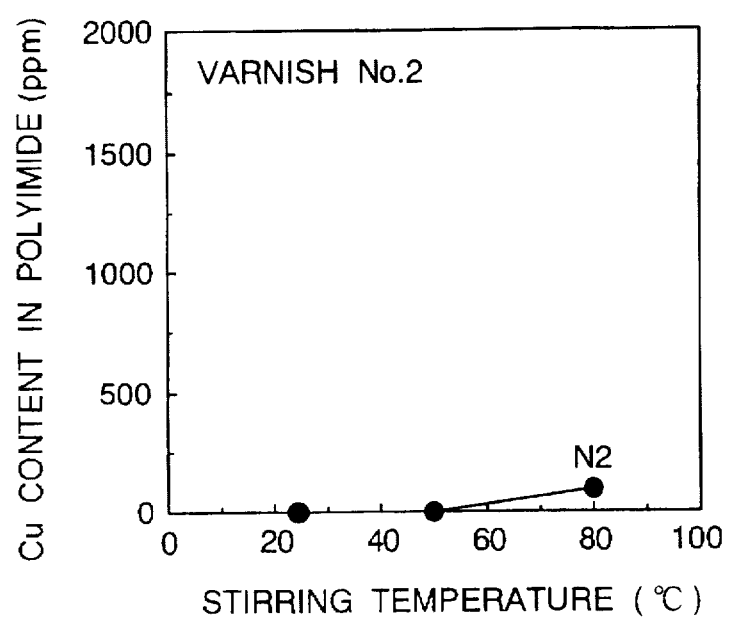
FIG. 3 is a graph representing the reaction between copper and polyimide precursor in Embodiment 2.

The inventors of the present invention conducted the same experiment as that in Embodiment 1, except for use of the vanish containing No. 2 basic compound. The result is shown in FIG. 3. As illustrated in the drawing, almost no copper exuded into the varnish despite temperature rise. It has been revealed that use of weakly acidic polyimide precursor and atmosphere of low oxygen concentration are very effective for suppression of reaction between copper and polyimide precursor. It can been seen that reaction between copper and polyimide precursor is more suppressed in Embodiment 2 than in Embodiment 1.

(Comparative Embodiment 1)

Figure 4:
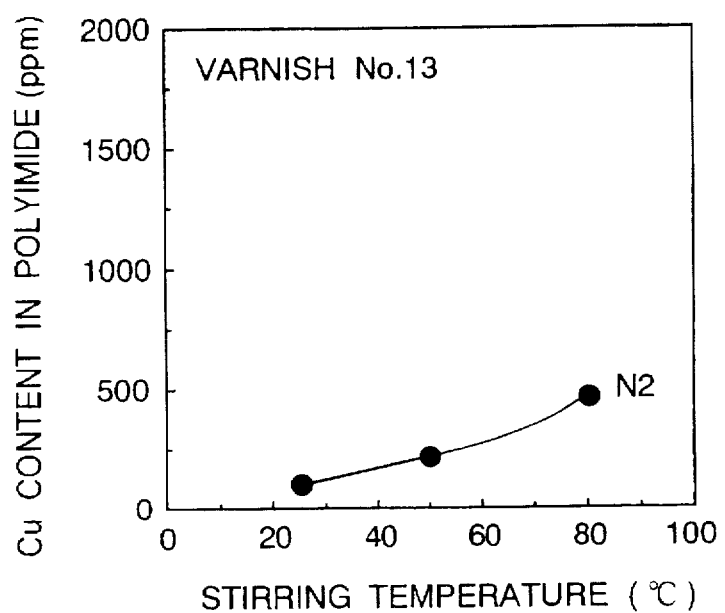
FIG. 4 is a graph representing the reaction between copper and polyimide precursor in Comparative Embodiment 1.

The inventors of the present invention conducted the same experiment as that in Embodiment 1, except for use of No. 13 varnish in the Table 3. The result is shown in FIG. 4. As illustrated in the drawing, a greater amount of copper exudes into the varnish as temperature rises, and the absolute amount is by far the a greater than that of Embodiment 1 or 2. This suggests that use of high acid polyimide precursor in the atmosphere of low oxygen concentration makes it difficult to suppress reaction between copper and polyimide precursor. The present inventors reduced the oxygen concentration further and conducted the same test at 80 ppm, obtaining almost the same result as FIG. 4.

(Embodiment 3)

Figure 5:
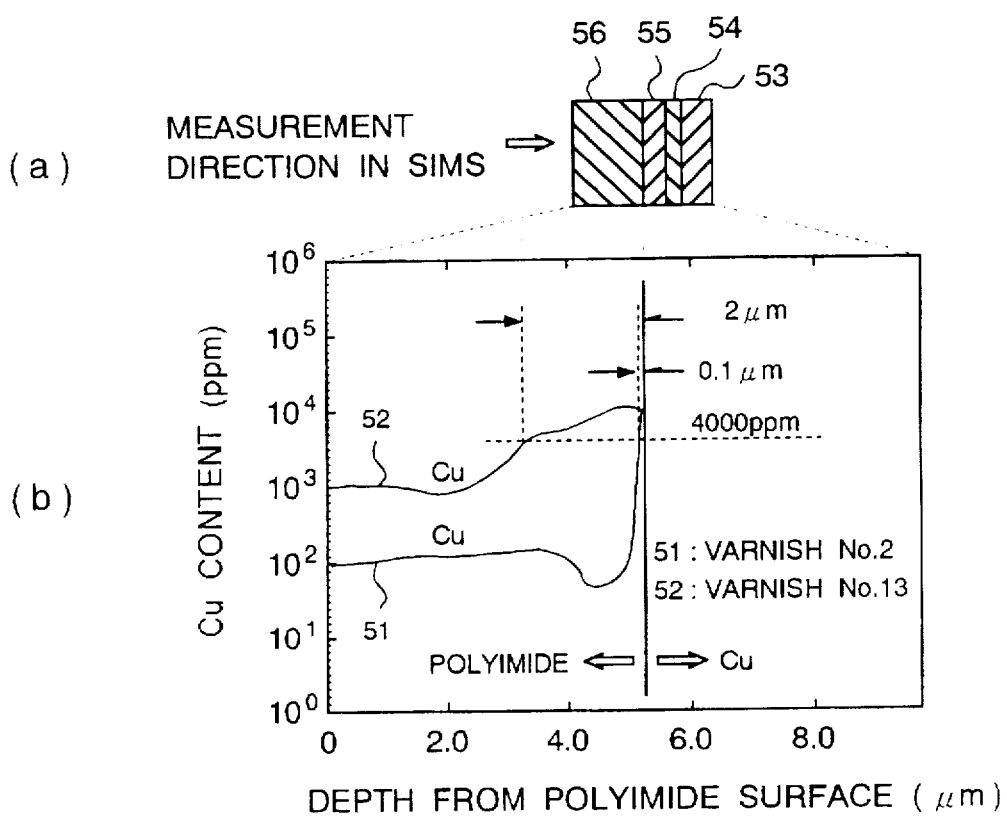
FIGS. 5(A), 5(b) are a partial sectional view, a graph illustrating the result of using the SIMS for observation of the concentration distribution of the copper exuding into the polyimide film, and broken lines connecting the corresponding portions of the sectional view and the graph.

A 0.05-micron thick chromium film and a 2-micron thick copper film were formed on the silicon wafer (having a diameter of 4 inches) in that order by the sputtering method, and the No. 2 varnish of the Table 2 (prepared in Example of Synthesis 2) was coated to it by spinning. After it was put into a baking furnace at 23° C. under nitrogen gas flow, the temperature was raised to 400° C. at the rate of 2° C. per minute; then it was held in that state for 60 minutes to be taken out thereafter. Oxygen concentration in the baking furnace was 6 to 10 ppm at this time. The concentration of the copper of the wafer taken out was measured from the polyimide to the direction of depth by SIMS (Secondary Ion Mass Spectrometry) method. The result is shown in FIG. 5. The upper portion (a) of FIG. 5 is a partial sectional view of the measured wafer. This wafer is provided with chromium layer 54, copper layer 55 and polyimide layer 56 in that order on substrate 53. The lower portion (b) of FIG. 5 is a graph showing the result of the measurement according to the SIMS method. The measurement result in the present Embodiment 3 is illustrated as curve 51.

This graph shows that copper concentration was kept low up to the vicinity of the interface between polyimide and copper in the present Embodiment 3. It can be seen that, especially in the range of copper concentration of 4000 ppm or more in the vicinity of the interface, copper is present at a high concentration only when the thickness is as small as 0.1 μm or less. It has been revealed from this result that, not only in the temperature range from room temperature to 80° C. as shown in said Embodiments 1 and 2, but also over the entire temperature process of polyimide formation, use of atmosphere of low oxygen concentration and weakly acidic polyimide precursor suppress reaction between copper and polyimide, thereby preventing polyimide from being decomposed.

Almost no change was observed in the measurement result according to the SIMS method even when the wafer produced for SIMS in the present Embodiment was subjected to additional heating under nitrogen gas flow at 400° C. Thus, it has been shown that, after the polyimide precursor has been completely converted into imide, almost no copper enters polyimide.

(Comparative Embodiment 2)

The authors of the present invention measured the copper concentration of the wafer prepared in the same way as Embodiment 3 except for the use of varnish No. 13. The measurement result is illustrated in the portion (b) of FIG. 5 as curve 52. It shows that use of strongly acidic varnish leads to a great amount of copper exuding into the polyimide, despite reduction in oxygen concentration. It can be seen that the copper is present over the very thick range of about 2 μm especially in the scope of cooper concentration of 4000 ppm or more close to the interface, and it is present on the surface of polyimide at the concentration of 1000ppm or more over almost all the range.

The wafer produced for SIMS in the present Comparative Embodiment was subjected to additional heating for ten hours under nitrogen gas flow at 400° C., resulting in polyimide becoming very brittle and cracks having occurred to many places; the polyimide film was observed to be peeled off. It must be added in this connection that the No. 13 varnish directly formed on the silicon wafer without forming copper film was also subjected to the same heating, but no big changes such as polyimide becoming brittle were not observed. Thus, it can be seen that the polyimide becoming brittle and cracks occurring to the copper are caused by a great amount of copper exuding into polyimide.
(Embodiment 4)

A 0.05-micron thick chromium film and a 2-micron thick copper film were formed on the silicon wafer (having a diameter of 4 inches) in that order by the sputtering method, and the No. 2 varnish of the Table 2 was coated to it by spinning. After it was put into a baking furnace at 23° C. under nitrogen gas flow, the temperature was raised to 400° C. at the rate of 2° C. per minute; then it was held in that state for 60 minutes to be taken out thereafter. Oxygen concentration in the baking furnace was prepared in four types; 10 ppm (0.001%), 1000ppm (0.1%), 10000ppm (1%) and 20.6% (air). The chromium film with copper film and polyimide film formed thereto was peeled off the wafer. Chromium and copper were removed by wet etching from this film of three layers; chromium, copper and polyimide, thereby obtaining polyimide film.

Figure 6:
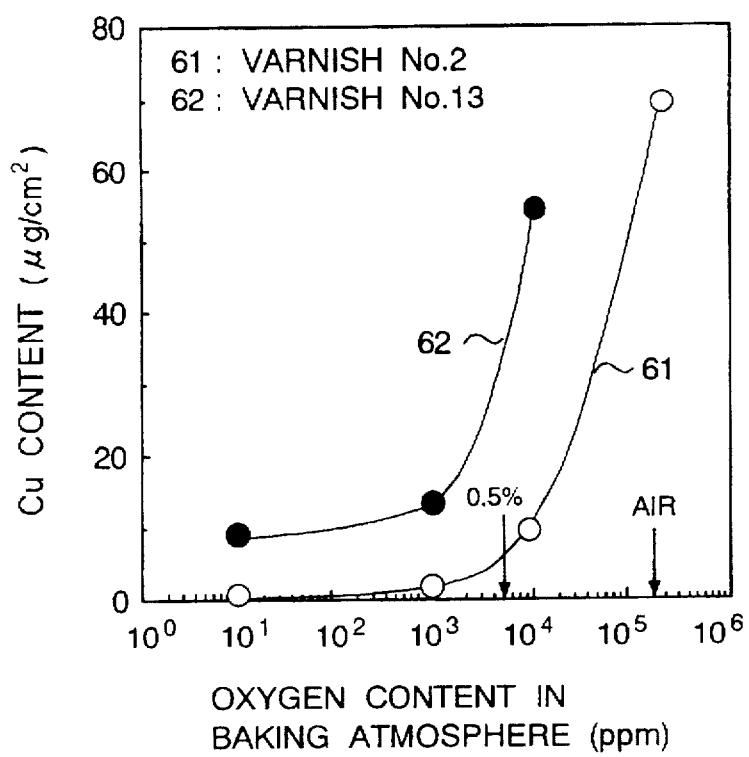
FIG. 6 is a graph showing the result of using fluoroscopy to measure the volume of copper exuding into the polyimide film.

The amount of copper contained in the polyimide film obtained in this way was determined by fluoroscopy. This result is shown as Curve 61 in FIG. 6. As illustrated in the graph, it can be seen from Embodiment 4 that almost no copper enters polyimide in the range of low oxygen concentration, but the amount of copper exhibits a sudden increase when the oxygen concentration exceeds 1%. Thus, in the entire temperature process of polyimide formation, use of atmosphere of low oxygen concentration and weakly acidic polyimide precursor suppress effectively the reaction between copper and polyimide. FIG. 6 shows that keeping the oxygen concentration 0.5% or less is effective to ensure virtual prevention of reaction between copper and polyimide precursor.

(Comparative Embodiment 3)

The inventors of the present invention conducted the same experiment as that in Embodiment 4, except for use of No. 13 varnish in the Table 3. The result is shown as Curve 62 in FIG. 6. As illustrated in the drawing, Comparative Embodiment 3 shows that use of strongly acidic varnish causes a greater amount of copper to exude into the varnish, despite reduction in oxygen concentration.

It must be added in this connection that, if air is used as the atmosphere of the baking furnace, the formed polyimide film was so brittle that it could not be peeled off; therefore, determination of the copper was not possible.

(Embodiment 5)

Aluminum electrode was formed on the polyimide film produced in Embodiment 4, and the dielectric constant of the polyimide film was measured. The result is shown in the column of varnish No. 2 in Table 4. It should be noted, however, that the polyimide formed by applying varnish No. 2 directly on the silicon wafer has a relative dielectric constant of 3.1. As shown in said Table, it has been revealed from the present Embodiment that dielectric constant is much increased when the oxygen concentration in the backing atmosphere is 1% or more, whereas the normal value of 3.1 is shown up to 1000 ppm. The polyimide film formed by applying varnish No. 2 directly on the silicon wafer did not show much increase in the dielectric constant when baked in air; therefore, the rise of dielectric constant is considered to be caused by copper exuding into polyimide. As can be seen in this Embodiment, use of atmosphere of low oxygen concentration and weakly acidic polyimide precursor provides effective prevention of dielectric constant from rising.

TABLE 4

Relative dielectric constant of polyimide film containing copper

| Oxygen concentration in the baking atmosphere | Varnish No. 2 | Varnish No. 13 |
|---|---|---|
| 10 ppm (0.001%) | 3.1 | 3.6 |
| 1000 ppm (0.1%) | 3.1 | 3.8 |
| 10000 ppm (1%) | 3.5 | 6 to 8 |
| Air (20.6%) | 6 to 9 | Decomposed |

Frequency for measurement: 1 MHz
Measuring temperature: 23° C.
Polyimide film thickness: 5.5 to 6 µm
(Comparative Embodiment 4)

The inventors of the present invention conducted the same experiment as that in Embodiment 5, except for use of No. 13 varnish. The result is shown in the column of varnish No. 13 given in Table 4. The polyimide formed by applying varnish No. 13 directly on the silicon wafer has a relative dielectric constant of 3.5. As a result of the experiment given in this Table, it can be seen that dielectric constant start to rise when the oxygen concentration is 10 ppm, but it exhibits a sudden increase when the oxygen concentration exceeds 1%. Comparison with Embodiment 5 has revealed that use of strongly acidic polyimide precursor makes it difficult to prevent dielectric constant from rising, even when oxygen concentration in the baking atmosphere is kept low.
(Embodiment 6)

FIGS. 1a, 1b, 1c, 1d, 1e, 1f, 1g, 1h, 1i, 1j, 1k and 1l are drawings illustrating represent the copper-polyimide system multilayer wiring structure manufacturing process according to the present invention.

(1) The mullite ceramic substrate 11 (shown in FIG. 1a, 127 mm square, 3 m thick) provided with tungsten wiring 22 was prepared inside.

Figure 1B:
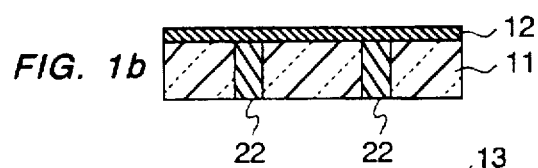

(2) A chromium layer (having a film thickness of 0.05 µm) and a copper layer (0.5 µm) were formed in that order by sputtering method on the surface forming the wiring layer of substrate 11 as underground film for plating, thereby forming an electrode layer 12 (FIG. 1b).

Figure 1C:
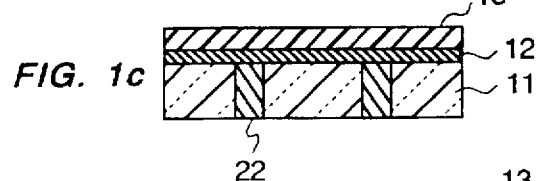
Figure 1D:
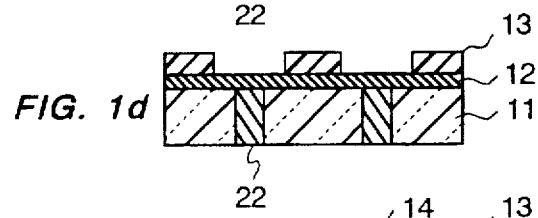
Figure 1E:
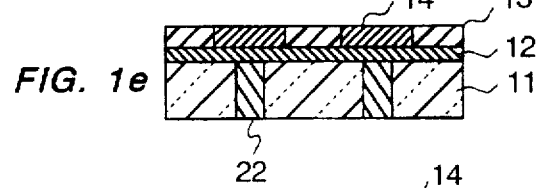
Figure 1F:
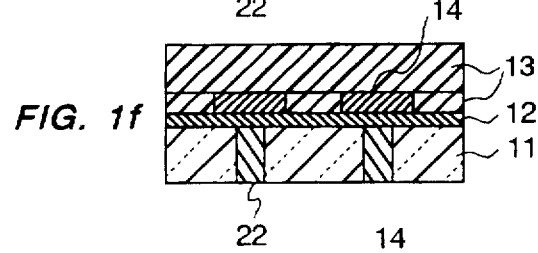
Figure 1G:
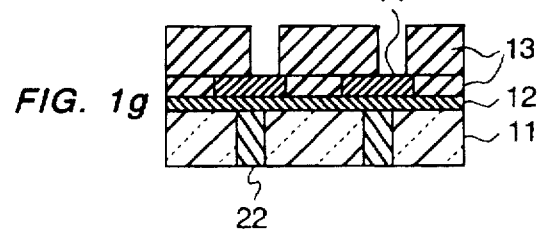
Figure 1H:
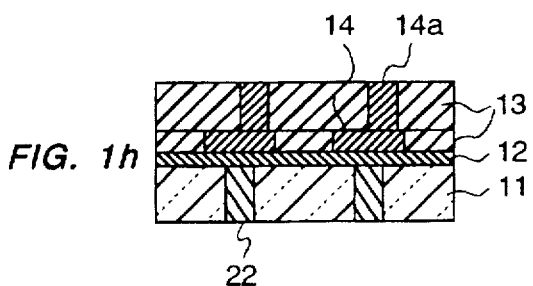

(3) Then the positive resist 13 was coated on the electrode 12 by spinning, and was dried in nitrogen atmosphere at 90° C. for 30 minutes. The resist 13 was 10 µm thick at this time (FIG. 1c). The substrate with resist film 13 prepared in this way was subjected to exposure, development and rinsing by the specified mask, thereby obtaining the specified resist pattern (FIG. 1d). After that, it was copper plated by electroplating to get copper wiring layer 14 (FIG. 1e). Plating solution comprised was $CuSO_4/5H_2O$ (70 g/l), $H_2SO_4$ (140 g/l) and HCl (50 ppm) with the current density of 1.0 (A/dm$^2$); 35 minutes were required to get the 8 micron-thick copper. After copper plating, it was washed by water and dried at 90° C. for one hour.

Figure 1I:
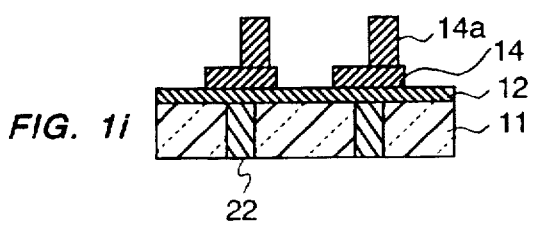

(4) Furthermore, copper via wiring 14a was formed by repeating step (3) (FIGS. 1c to 1e and FIGS. 1f to 1h); then the resist 13 was removed by releasing solution (FIG. 1i).

Figure 1J:
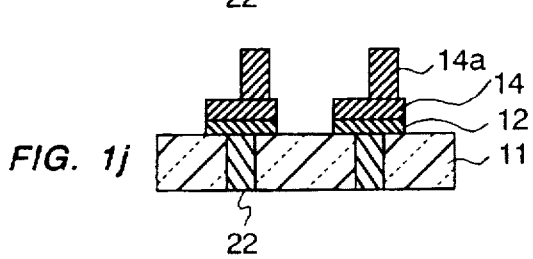

(5) Then, the portions of the copper and chromium as plating underground film which were not in contact with the copper plated layers 14 an 14a formed by steps (3) and (4) were removed by ammonium chloride based etching solution and potassium permanganate based etching solution respectively on a selective basis (FIG. 1j).

(6) After that, the No. 1 varnish in Table 2 as the polyimide precursor directly in contact with the copper was coated on it by spinning, and it was put in a heating furnace at 30° C. under nitrogen gas flow with a oxygen concentration of 500 ppm. The temperature was made to rise at the rate of 4° C. per minute, and it was held 200° C. for 30 minutes. The temperature was further made to rise. It was heated at 350° C. for 60 minutes under the similar nitrogen gas flow, thereby obtaining the 1st insulation film 16. The film thickness after heating was 5 μm. It should be noted that, in the present Embodiment 6, each thickness of the 1st insulation film 16, the 2nd insulation film 17 and polyimide layer 15 was measured at the position where the 1st insulation film 16 are in contact with insulation layer (ceramic substrate 11 or polyimide layer 15) immediately below, not through wiring 14.

Furthermore, No. 9 varnish in Table 2 to be made into the low thermal expansion polyimide was coated by spinning, and it was put into a heating furnace at 140° C. under nitrogen gas flow having a oxygen concentration of 500 ppm, where it was held for 60 minutes. Then the temperature was made to rise at the rate of 4° C. per minute, and it was held at 200° C. for 30 minutes. The temperature was further made to rise at the rate of 4° C. per minute and it was heated at 350° C. for 60 minutes under the similar nitrogen gas flow, thereby obtaining the 2nd insulation film 17. The thickness of the film 17 obtained from No. 9 by heating was 13 μm.

Figure 1K:
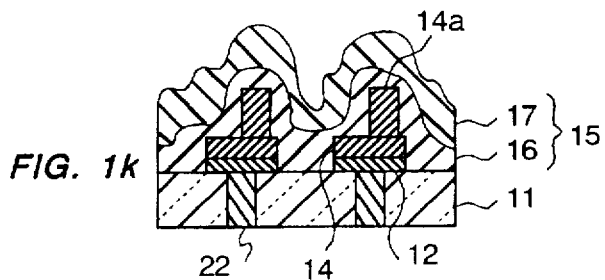

The entire thickness of the polyimide film 15 comprising the combination of 1st insulation film 16 and 2nd insulation film 17 was 18 μm (FIG. 1k).

Figure 1L:
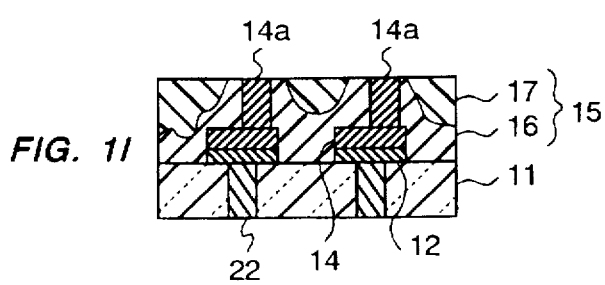

(7) The surface of the polyimide layer 15 obtained in the above step was polished by the tape attached with alumina particle (#500 to #4000) to achieve planarization of polyimide layer 15, thereby ensuring that the entire thickness of the polyimide film 15 was 16 μm (FIG. 1l).

(8) Furthermore, steps (2) to (7) (FIGS. 1b to 1l) were repeated three times, to obtain the copper-polyimide based multilayer wiring structures provided with four wiring layers.

The multilayer wiring structures obtained from the above steps had no void, peeling or crack close to the interface between the copper and polyimide, and excellent electric conductivity was confirmed for all wirings.

(Embodiments 7 to 9)

Copper-polyimide based multilayer wiring structures of 5 wiring layers were obtained using the same procedure as in Embodiment 6, except that No. 2, No. 4 and No. 6 polyimide precursor varnishes in Table 2 were used to form the 1st insulation film (polyimide film in direct contact with the copper) 16, while No. 9 varnish in Table 2 was used to form the 2nd insulation film (polyimide layer made of low thermal expansion polyimide) not in direct contact with the copper) 17. It should be noted, however, that, in Embodiment 6, steps (2) to (7) were repeated three times in step (8), but in Embodiments 7 to 9, steps (2) to (7) were repeated four times. The multilayer wiring structures obtained therefrom had no void, peeling or crack close to the interface between the copper and polyimide, excellent electric conductivity was confirmed for all wirings.

(Embodiments 10 to 15)

Copper-polyimide based multilayer wiring structures having 5 wiring layers were obtained using the same procedure as in Embodiment 7, except that the 1st insulation film 16 was formed by No. 3, No. 5, No. 7, No. 8 No. 14 and No. 15 polyimide precursor varnishes in Table 2, while the 2nd insulation film 17 was formed by No. 10 polyimide precursor varnishes in Table 2. The multilayer wiring structures obtained therefrom had no void, peeling or crack close to the interface between the copper and polyimide, excellent electric conductivity was confirmed for all wirings.

(COMPARATIVE EMBODIMENTS 5 and 6)

Wiring structures were manufactured using the same procedure as in steps (1) to (7) of Embodiment 6, except that the 1st insulation film 16 was formed using No. 11 or No. 12 in Table 3.

In step (6), No. 11 or No. 12 polyimide precursor varnish was coated on the copper of the wiring, and it was heated at 350° C. for 60 minutes, thereby obtaining the 1st insulation film 16. Microscopic observation of this 1st insulation film 16 revealed that the portion around the copper wiring of polyimide was discolored in greenish brown both in No. 11 (Comparative Embodiment 5) and No. 12 (Comparative Embodiment 6).

Furthermore, similar to the case of Embodiment 6, No. 9 polyimide precursor varnish was coated on it, and it was heated at 350° C. for 60 minutes, thereby obtaining the 2nd insulation film 17. Microscopic observation of the multilayer wiring structures provided with polyimide layer 15 formed in this way revealed that blisters was present between the 1st insulation film 16 and 2nd insulation film 17 both in No. 11 (Comparative Embodiment 5) and No. 12 (Comparative Embodiment 6).

After that, planarization of polyimide was conducted by tape polishing in step (7). It was found out that grooves were formed between the 1st insulation film 16 and copper wiring 14, and peeling was observed. This is considered to be because, after a great deal of copper have exuded into the polyimide, it was exposed to the heat of 350° C.; therefore, the portion around the interface with the copper of the polyimide film was decomposed and the interface adhesion was reduced.

(Comparative Embodiment 7)

Multilayer wiring structures were produced using the same procedure as in Embodiment 6, except that the 1st insulation film 16 was formed by No. 2 varnish in Table 2 while the 2nd insulation film 17 was also formed by No. 2 varnish in Table 2 instead of No. 9 varnish which is low thermal expansion polyimide.

As a result, polyimide film 15 was made plane by polishing (step (7)) after formation of polyimide film 15 (step (6)); then cracks were observed around the copper via wiring 14a. After that, electrode 12 for plating was formed by sputtering (second step (2)), and electrode 12 was observed to be broken on cracked portions. Furthermore, the upper layer wiring was plated (second step (3)), and many places were found not yet plated. From this stage, the step could not proceed any further, and production of wiring structures could not be completed in this Comparative Embodiment.

(Embodiment 16)

Figure 7:
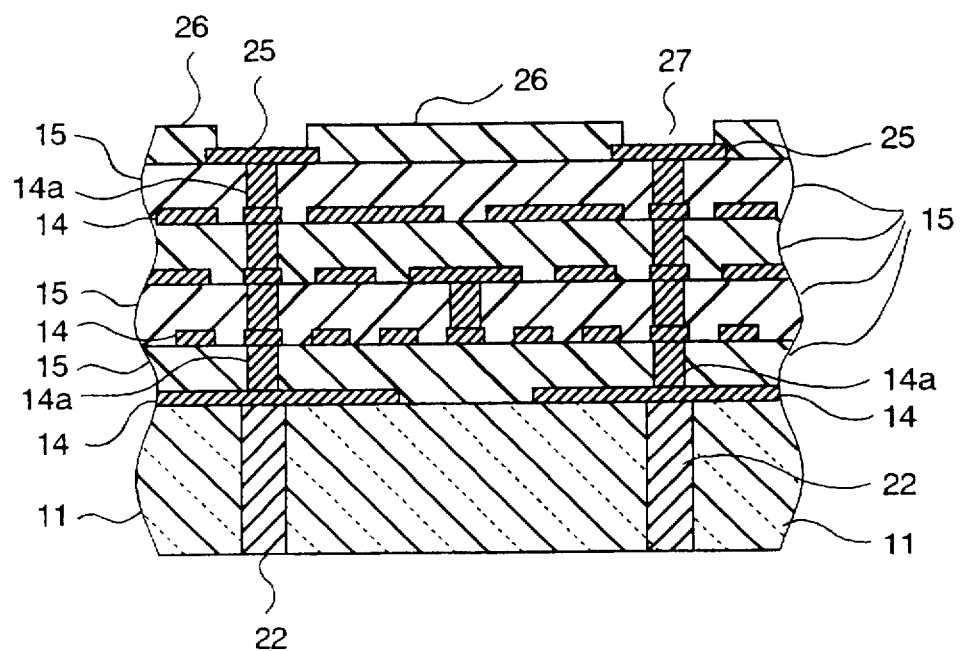
FIG. 7 is a partial sectional view showing the multilayer wiring structure manufactured according to the present invention.
Figure 8A:
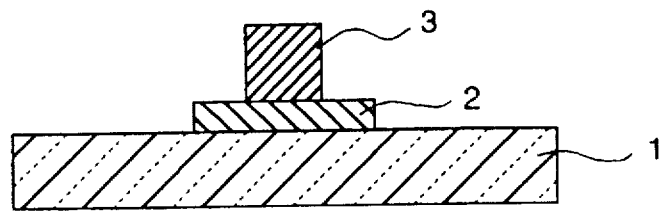
FIGS. 8a, 8b and 8c are sectional views illustrating the wiring structure according to the prior art technology.
Figure 8B:
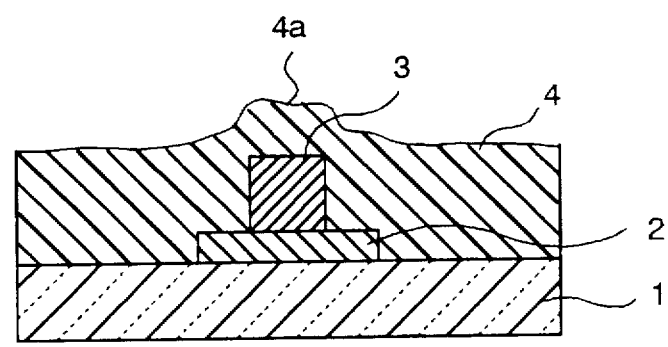
Figure 8C:
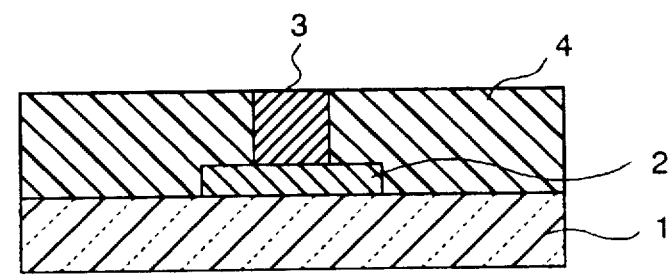

The same procedures as in Embodiment 6 were used to manufacture the wiring structures provided with the four-layer copper wiring 14. The film is formed by sputtering in the order of chromium (0.05 μm), copper (5 μm), chromium (0.05 μm) and nickel (2 μm) on the exposed portion of the via wiring 14a on the top layer and the surface of its surrounding polyimide layer 15. Patterning was made by wet etching using the resist to form surface electrode 25. Furthermore, protective cover 26 was formed around this surface electrode 25 to prevent solder from spreading when connected with LSI by soldering. No. 2 polyimide precursor varnish was coated on the protective cover 26 by spinning, and was put into the baking furnace at 30° C. under nitrogen gas flow; then the temperature was again made to rise at the rate of 4° C. per minute. When it had reached 400° C., it was held for 60 minutes, thereby obtaining the protective cover 26. In this case, the oxygen concentration inside the baking furnace was 0.1%. FIG. 7 illustrates the wiring structures. The opening 27 of the protective cover 26 of the wiring structures obtained in this way was processed by the excimer laser using KrF gas, to be formed into a connection with the LSI. The protective cover 26 was formed in a satisfactory manner without any abnormality.

(Comparative Embodiment 8)

The same procedures as in Embodiment 16 were used to manufacture the wiring structures, except that No. 11 varnish in Table 3 was used as the polyimide precursor to form the protective cover 26. It was taken out and observed after coating with varnish No. 11 and baking. It was found out that some part of protective cover 26 was discolored in brown on the side wall of surface electrode 25 and blister was present on some part. Then the opening 27 of the protective cover 26 was processed by the excimer laser using KrF gas, and part of polyimide layer 26 was found to be peeled off the end of electrode 25. This is considered to have resulted from reaction between the polyimide precursor and copper the side wall on the end of the electrode 25.

(Embodiment 17)

The following describes an example of another method of obtaining the similar structure to that shown in FIGS. 1a to 11 by forming part of the wiring by sputtering with reference to FIGS. 9a, 9b, 9c, 9d, 9e, 9f, 9g, 9h, 9i and 9j.

Figure 9A:
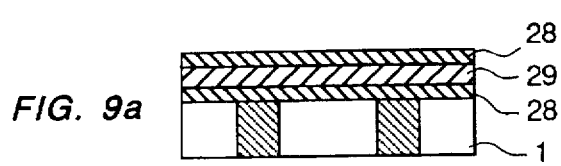
FIGS. 9a, 9b, 9c, 9d, 9e, 9f, 9g, 9h, 9i and 9j are sectional views illustrating the copper polyimide multilayer wiring structure manufacturing process in Embodiment 17.
Figure 9B:
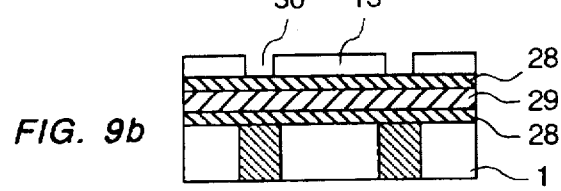
Figure 9C:
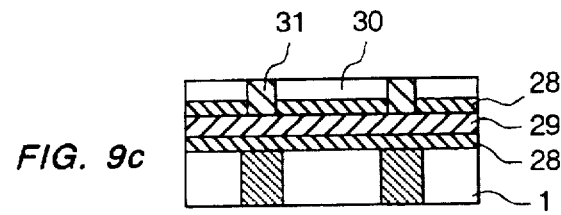
Figure 9D:
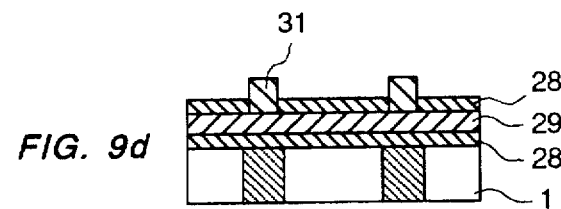
Figure 9E:
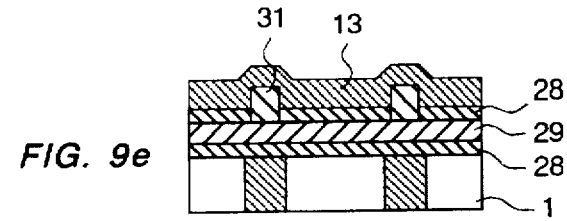
Figure 9F:
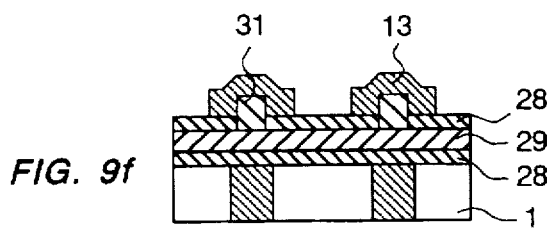
Figure 9G:
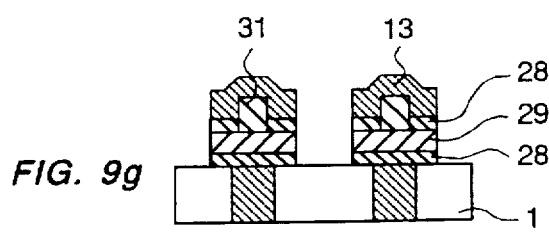
Figure 9H:
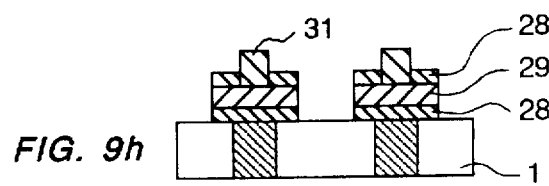

Chromium 28 was formed on the substrate 1 by sputtering, with the film of chromium 28 having a thickness of 0.05 μm and the film of conductor layer 29 mainly comprising the copper having a thickness of was 6 μm, so to as to hold conductor 29 mainly comprising the copper in-between (FIG. 9a). Then the photoresist 13 was formed to have a film thickness of 17 μm forming via hole 30 (FIG. 9b). Exposed metallic material 28 of the portion 30 was etched, and via wiring 31 mainly comprising copper was formed to a thickness of 17 μm inside the via hole 30 by plating (FIG. 9c). It should be noted that the plating procedure was used under the same conditions as Embodiment 6. Then after the photoresist 13 was peeled (FIG. 9d), via wiring 31 was covered with photoresist 13 (FIG. 9e), and the specified mask was used for exposure and development, thereby forming the pattern (FIG. 9f). Then the metallic material 28 and conductor layer 29 were etched (FIG. 9g), and resist 13 was removed (FIG. 9h).

Figure 9I:
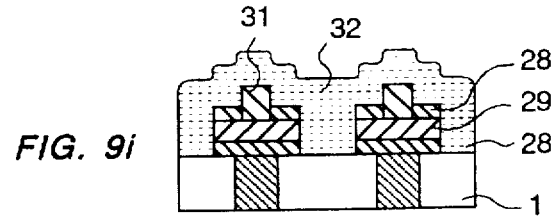
Figure 9J:
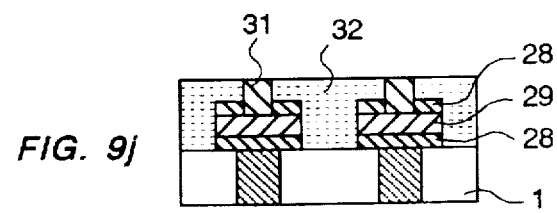

This was following by coating with No. 2 varnish in Table 2 as polyimide in direct contact with copper by spinning. It was put into the heating furnace at 70° C. under nitrogen gas flow having oxygen concentration of 100 ppm, and the temperature was made to rise at the rate of 2° C. per minutes. It was held at 350° C. for 60 minutes, thereby forming the insulation film of the lower layer when the insulation film 32 was composed of two layers. After heating, the film thickness was 6 μm. Furthermore, No. 9 varnish of Table 2 as the upper layer polyimide of the insulation film 32 was coated by spinning, and it was put into the heating furnace at 140° C. under nitrogen gas flow having oxygen concentration of 100 ppm. After being held for 60 minutes at 140° C., the temperature was made to rise at the rate of 4° C. per minutes and was held at 200° C. for 60 minutes, thereafter the temperature was made to rise again at the rate of 4° C. per minute, it was held at 350° C. for 60 minutes, thereby forming the entire insulation film 32. In this case, the entire film thickness of insulation film 32 was 20 μm (FIG. 9i). Then according to the same procedure as in Embodiment 6, insulation film 32 was polished to make it plane, so that the insulation film 32 would have a thickness of 18 μm (FIG. 9j).

Furthermore, said steps (FIGS. 9a to 9j) were repeated three times, thereby obtaining the copper-polyimide based multilayer wiring structures with four layers.

The multilayer wiring structures obtained from the above steps had no void, peeling or crack close to the interface between the copper and polyimide, and excellent electric conductivity was confirmed for all wirings.

As illustrated by Embodiments and Comparative Embodiments, the polyimide precursor used in the present invention has a low reactivity with copper to ensure excellent thermal, electric and mechanical characteristics of polyimide and superb interfacial adhesion between copper and polyimide, without polyimide deteriorating, even if there is a portion where copper and polyimide come in direct contact with each other. Furthermore, when the via wiring is formed, low reaction is ensured by formation of the insulation layer with low thermal expansion polyimide according to the present invention. This provides multilayer wiring structures featuring highly reliable wiring substitute as a whole, free from cracks on the polyimide film, as well as economical production method for such products.

What is claimed is:

1. A wiring structure having a wiring layer and an insulation layer, the wiring layer including a wiring, wherein at least a part of the wiring of said wiring layer comprises copper, and wherein said insulation layer comprises a polyimide obtained from a polyimide precursor composition containing a polyimide precursor having low acidity and having a repeating unit represented by the following general formula (Chemical formula 1):

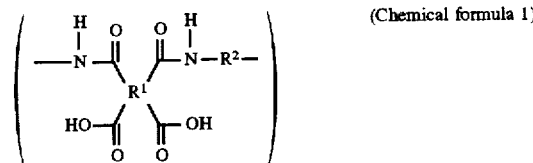
(Chemical formula 1)

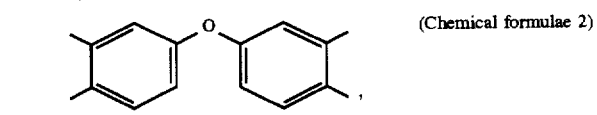
(Chemical formulae 2)

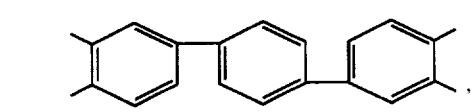

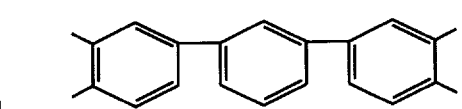

(where $R^1$ is at least one type of quadrivalent organic group selected from among the Chemical formulae 2, while $R^2$ is a bivalent organic group containing an aromatic ring).

2. A wiring structure according to claim 1 wherein said R2 is at least one type of the bivalent organic group selected from among the following Chemical formulae 3:

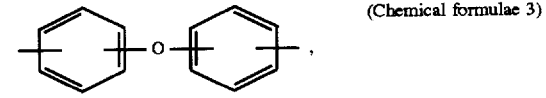
(Chemical formulae 3)

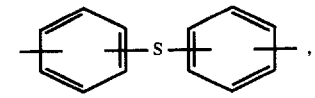

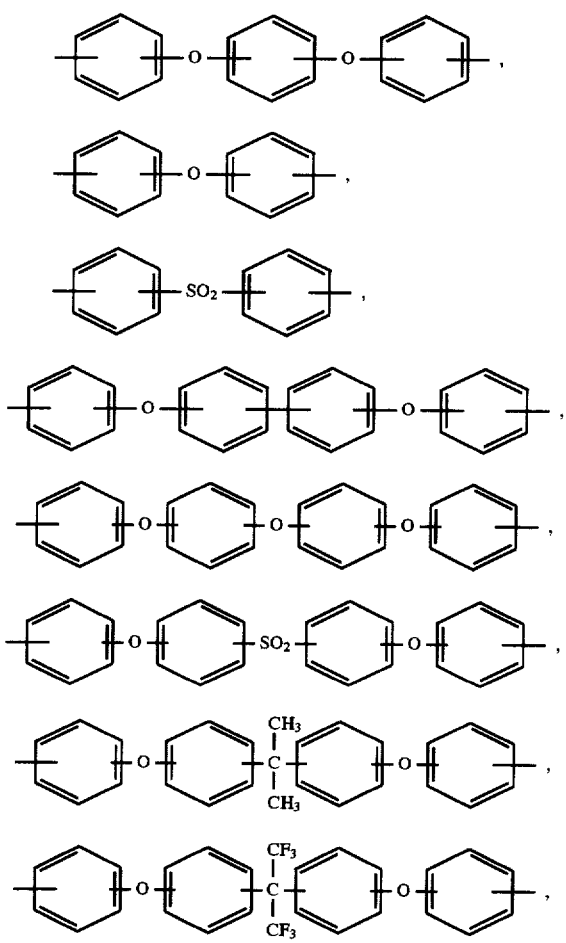
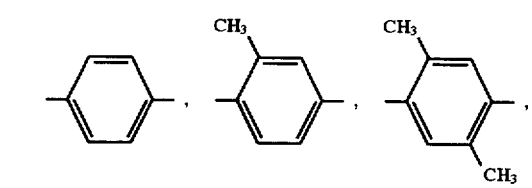
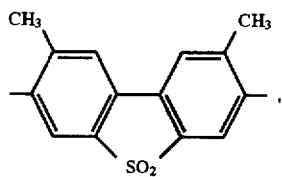
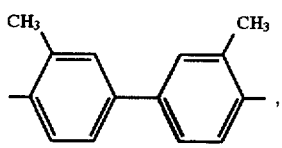
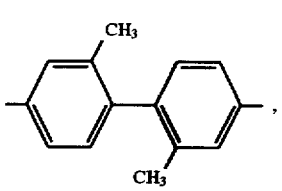

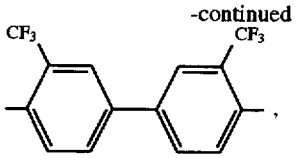
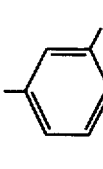
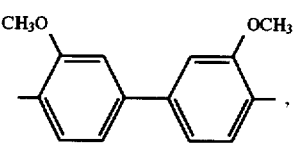
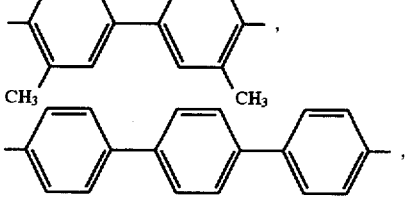
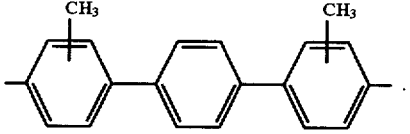

3. A wiring structure according to claim 1 wherein said polyimide precursor composition further comprises a basic compound which neutralizes carboxyl groups of the polyimide precursor and provides thermal curing of the polyimide precursor without much affecting stability of the polyimide precursor.

4. A wiring structure according to claim 3 wherein said basic compound is at least one type of amine compound selected from among the following Chemical formula 4:

(Chemical formulae 4)

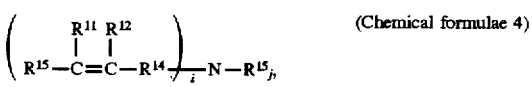
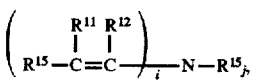
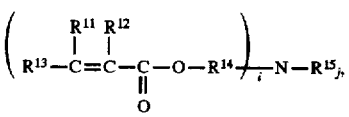
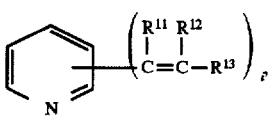

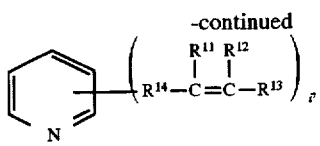

(where $R^{11}$, $R^{12}$, $R^{13}$ are groups selected from among the alkyl group, phenyl group and vinyl group with a hydrogen and carbon number 1 to 4, and $R^{14}$ is alkylene group, while $R^{15}$ is a group selected from among the alkyl group, phenyl group and vinyl group with a carbon number 1 to 4, and i+j=3 and i=1 to 3),

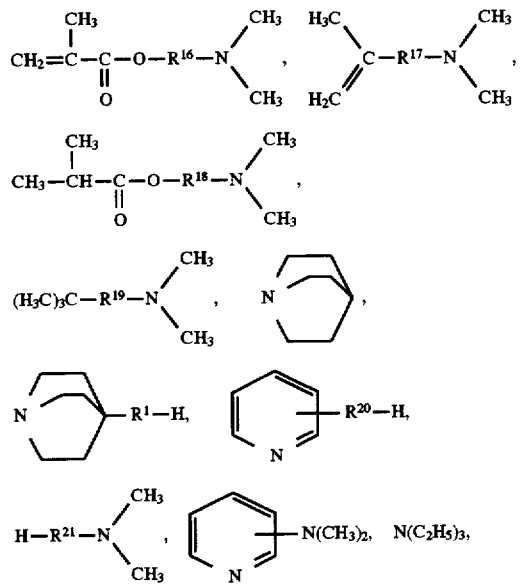

(where each of $R^{16}$ to $R^{21}$ is at least one type of group selected from among the alkylene group and phenylene group with a carbon number 1 to 6),

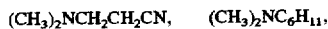

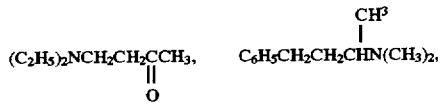

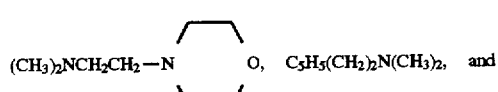

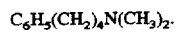

5. A wiring structure according to claim 3 wherein said polyimide precursor composition contains one equivalent or more of said basic compound.

6. A wiring structure according to claim 3 wherein said polyimide precursor composition contains the basic compound in such an amount that the number of reaction points is greater than the total number of carboxyl groups contained by all polyimide precursors.

7. A wiring structure according to claim 1 wherein the polyimide is obtained from the polyimide precursor composition by heating in an amount so as to form the polyimide.

8. A wiring structure having a wiring layer and an insulation layer, the wiring layer including a wiring, wherein at least a part of the wiring of said wiring layer comprises copper, and wherein said insulation layer has a layer comprising a polyimide obtained from a polyimide precursor composition containing a polyimide precursor having low acidity and having a repeating unit represented by the following general formula (Chemical formula 1):

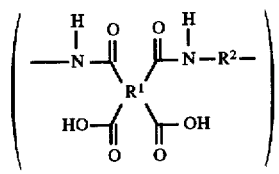

(Chemical formula 1)

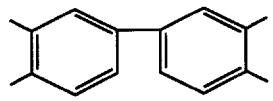

(Chemical formula 14)

(where $R^1$ is a quadrivalent organic group represented in (Chemical formula 14), while $R^2$ is a bivalent organic group containing an aromatic ring.

9. A wiring structure according to claim 8 wherein said R2 is at least one type of the bivalent organic group selected from among the following Chemical formulae 3:

(Chemical formulae 3)

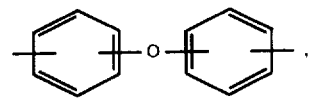

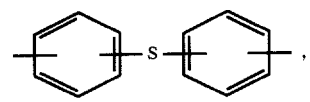

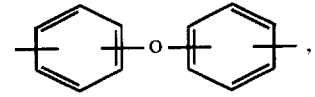

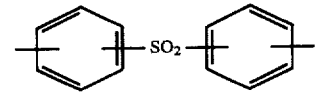

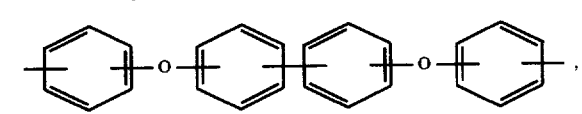

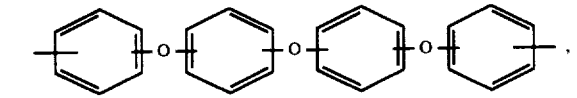

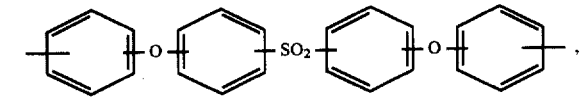

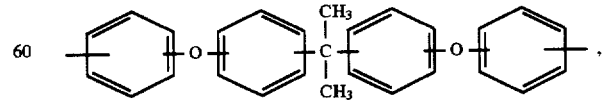

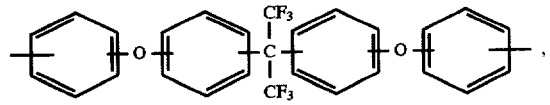

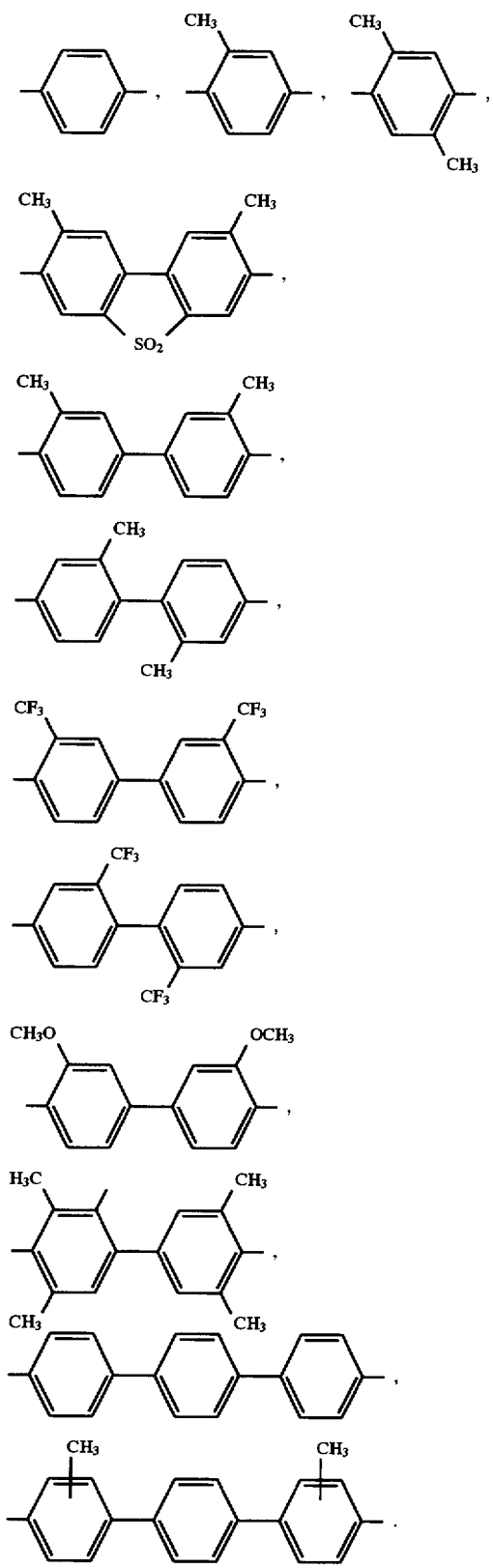

10. A wiring structure according to claim 8 characterized in that said polyimide precursor composition further comprises a basic compound which neutralizes carboxyl groups of the polyimide precursor and provides thermal curing of the polyimide precursor without much affecting stability of the polyimide precursor.

11. A wiring structure according to claim 8 wherein the polyimide is obtained from the polyimide precursor composition by heating in an amount so as to form the polyimide.

12. A wiring structure having a wiring layer and an insulation layer, the wiring layer including a wiring, wherein at least a part of the wiring of said wiring layer comprises copper, and wherein said insulation layer has at least a first insulation film formed on said wiring layer and a second insulation film formed on said first insulation film;

wherein said first insulation film comprises a first polyimide obtained from a first polyimide precursor composition containing a polyimide precursor having low acidity and having a repeating unit represented by the following general formula (Chemical formula 1):

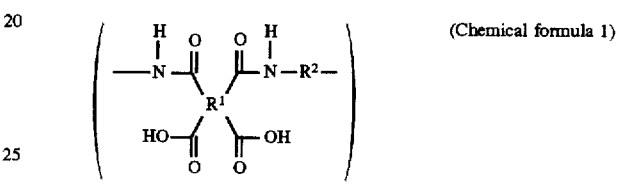

(Chemical formula 1)

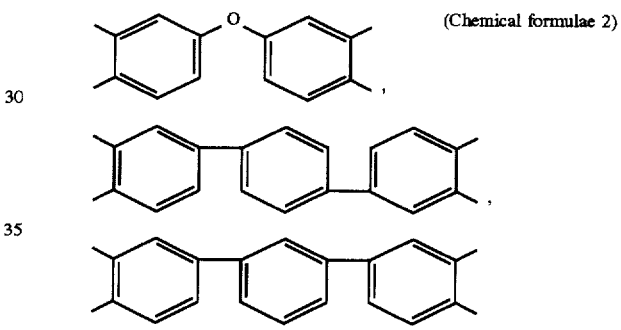

(Chemical formulae 2)

(where $R^1$ is at least one type of quadrivalent organic group selected from among the Chemical formulae 2, while $R^2$ is a bivalent organic group containing an aromatic ring), and wherein said second insulation film comprises a second polyimide which has a lower thermal expansion coefficient than said first polyimide.

13. A wiring structure according to claim 12 wherein said $R^2$ is at least one type of the bivalent organic group selected from among the following Chemical formulae 3:

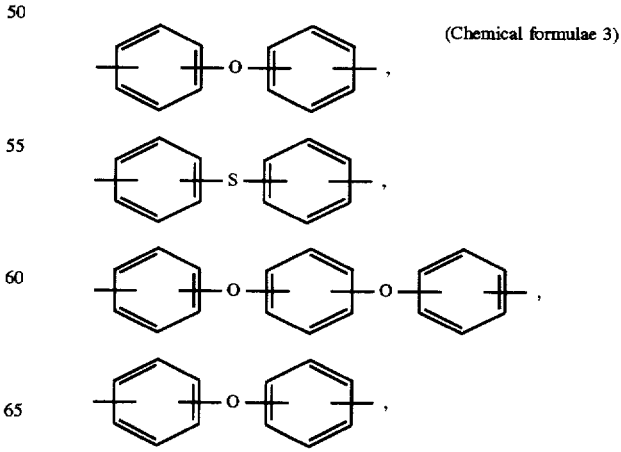

(Chemical formulae 3)

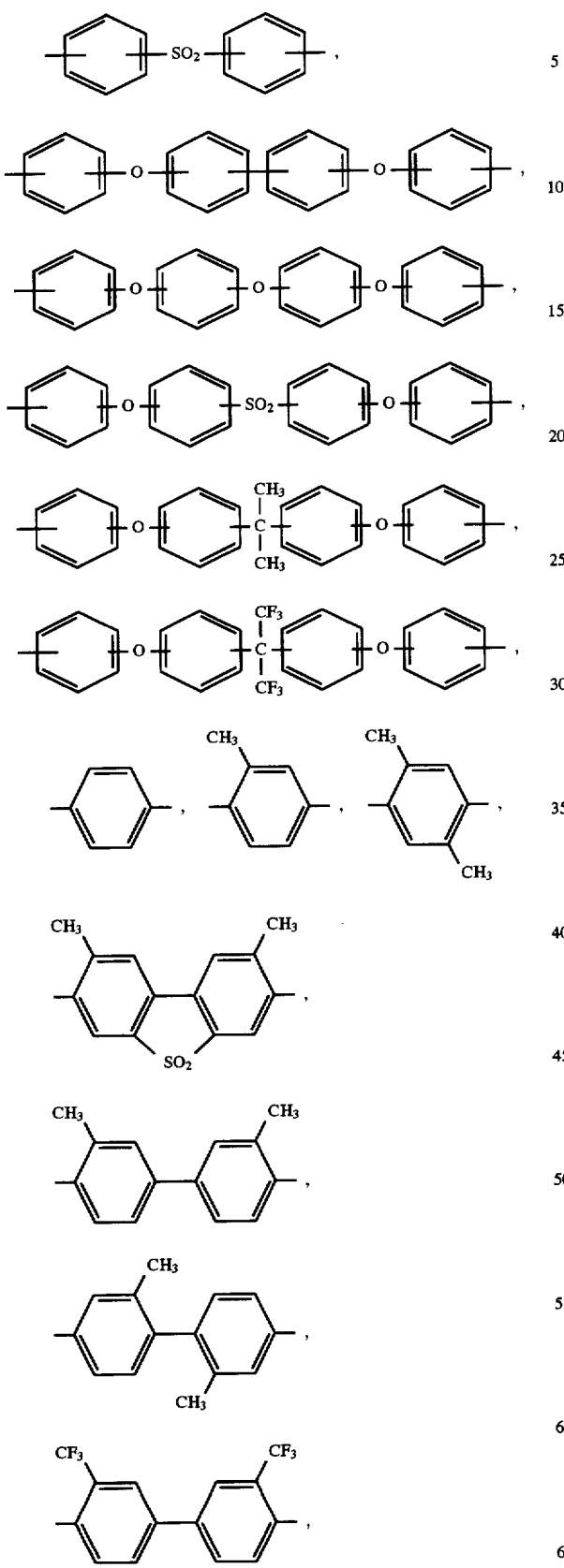

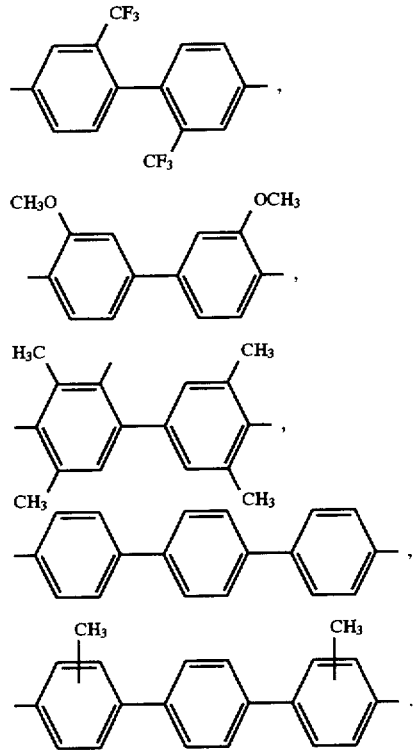

14. A wiring structure according to claim 12 wherein a thickness of said first insulation film is smaller than that of said second insulation film.

15. A wiring structure according to claim 12 wherein said first polyimide precursor composition includes at least one type of basic compound selected from among the following Chemical formula 4:

(Chemical formulae 4)

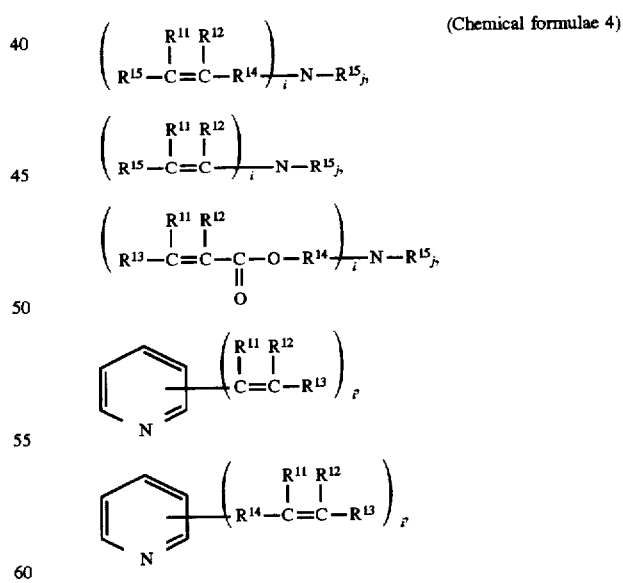

(where $R^{11}$, $R^{12}$, $R^{13}$ are groups selected from among the alkyl group, phenyl group and vinyl group with a hydrogen and carbon number 1 to 4, and $R^{14}$ is alkylene group, while $R^{15}$ is a group selected from among the alkyl group, phenyl group and vinyl group with a carbon number 1 to 4, and i+j=3 and i=1 to 3).

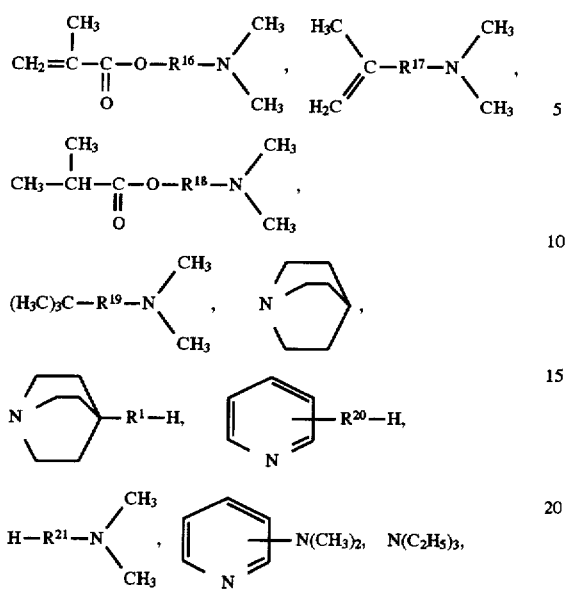

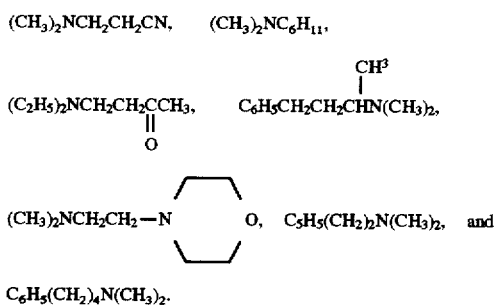

$C_6H_5(CH_2)_4N(CH_3)_2$.

16. A wiring structure according to claim 12 characterized in that (1) said second polyimide has as a repeating unit the structure represented by the following general formulae, (Chemical formula 5) and (Chemical formula 6); and (2) said second polyimide is a polyimide obtained from a second polyimide precursor composition containing the second polyimide precursor wherein the number of the repeating units represented by the general formula (Chemical formula 5) is less than 95, while that of the repeating units represented by the general formula (Chemical formula 6) is 5 or more, when the total of the number of the repeating units represented by the general formula (Chemical formula 5) contained in one molecule and that of the repeating units represented by the general formula (Chemical formula 6) is assumed as 100:

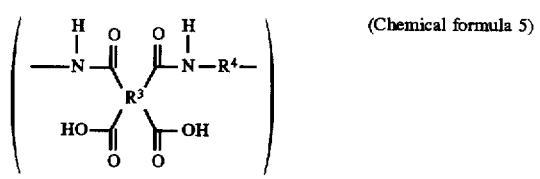

(Chemical formula 5)

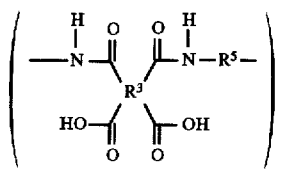

(Chemical formula 6)

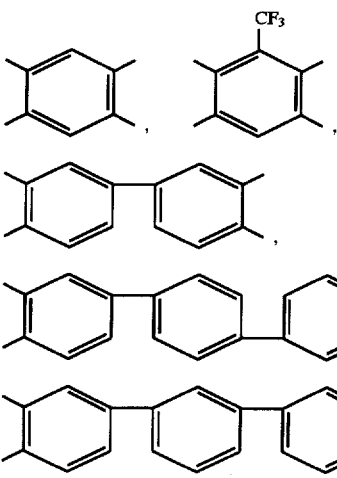

(Chemical formulae 7)

(where $R^3$ is at least one type of quadrivalent organic group selected from among Chemical formulae 7, and $R^4$ is at least one type of bivalent organic group selected from among the following Chemical formulae 8), while $R^5$ is a bivalent organic group selected from among the following Chemical formulae 9

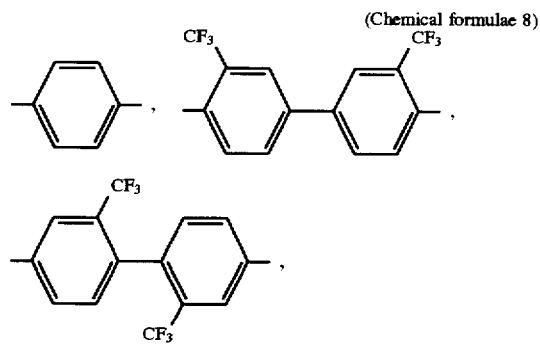

(Chemical formulae 8)

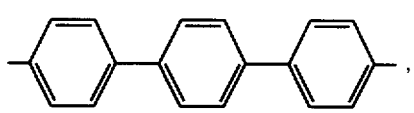

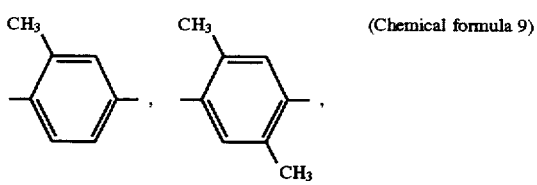

(Chemical formula 9)

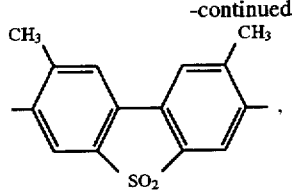

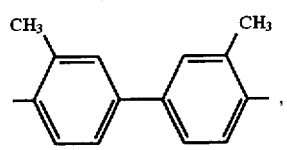

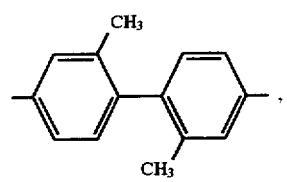

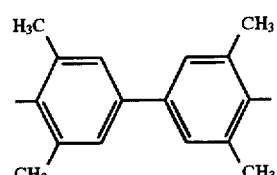

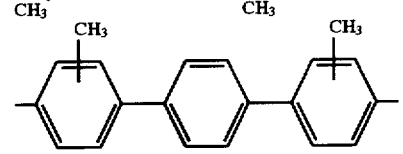

17. A wiring structure according to claim 16 wherein the second polyimide is obtained from the second polyimide precursor composition by heating in an amount so as to form the second polyimide.

18. A wiring structure according to claim 17 wherein the first polyimide is obtained from the first polyimide precursor composition by heating in an amount so as to form the first polyimide.

19. A wiring structure according to claim 12 characterized in that (1) said second polyimide has as a repeating unit the structure represented by the following general formulae (Chemical formula 10) and (Chemical formula 11); and (2) said second polyimide is a polyimide obtained from a second polyimide precursor composition containing the second polyimide precursor;

wherein a number of the repeating units represented by the general formula (Chemical formula 10) is from 85 to 50, while that of the repeating units represented by the general formula (Chemical formula 11) is from 50 to 15, when the total of the number of the repeating units represented by the general formula (Chemical formula 10) contained in one molecule and that of the repeating units represented by the general formula (Chemical formula 11) is assumed as 100:

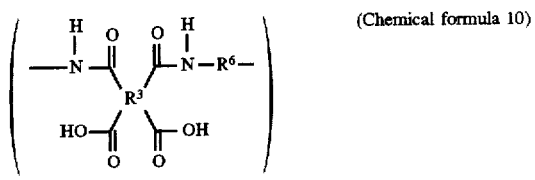

(Chemical formula 10)

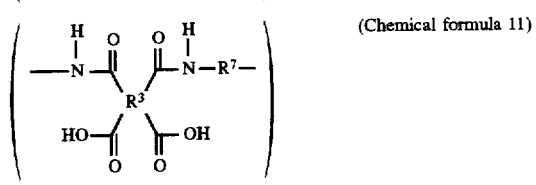

(Chemical formula 11)

(where $R^3$ is at least one type of quadrivalent organic group selected from among Chemical formulae 7, and $R^6$ is at least one type of bivalent organic group selected from among the following Chemical formulae 12, while $R^7$ is a bivalent organic group selected from among the following Chemical formulae 13:

(Chemical formulae 7)

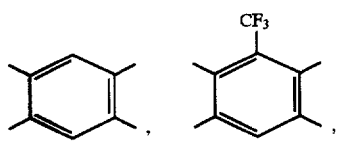

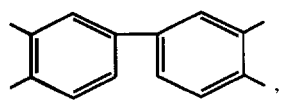

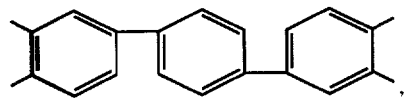

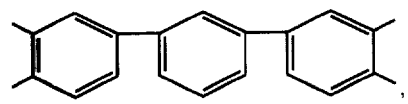

-continued
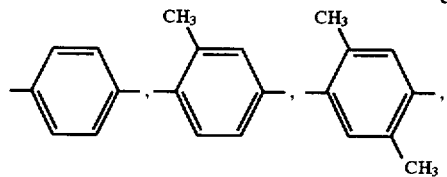
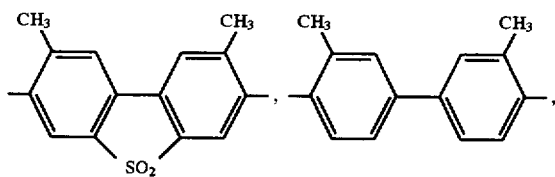
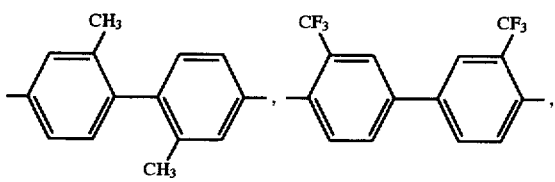
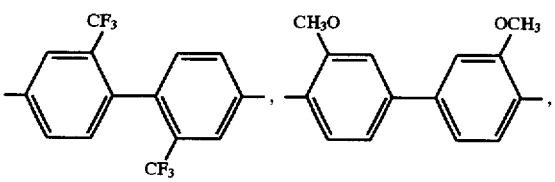
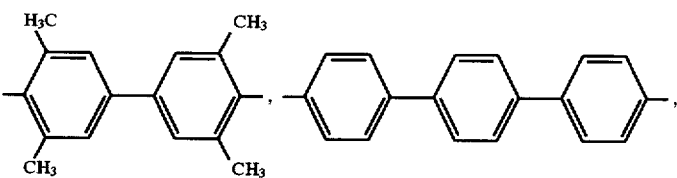
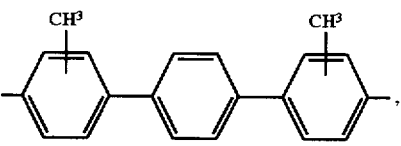
(Chemical formulae 12)
(Chemical formulae 13)
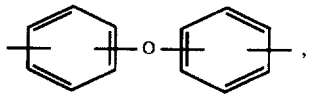
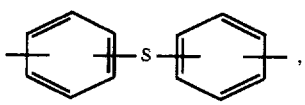
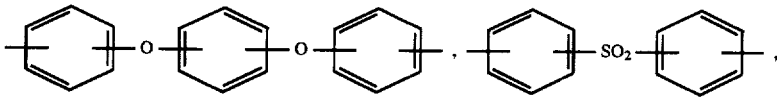
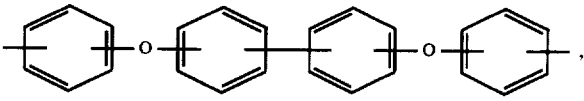
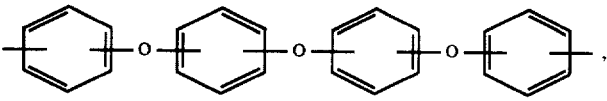

-continued

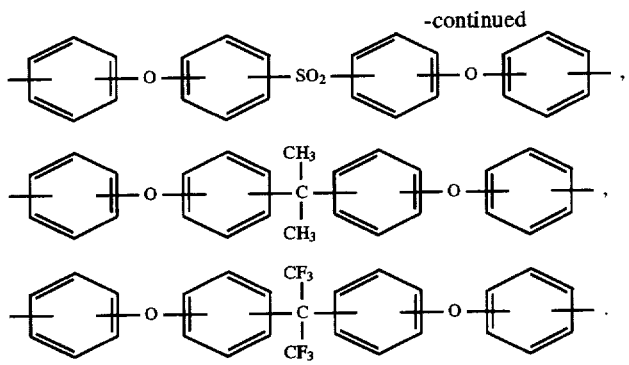

20. A wiring structure according to claim 19 wherein the second polyimide is obtained from the second polyimide precursor composition by heating in an amount so as to form the second polyimide.

21. A wiring structure according to claim 20 wherein the first polyimide is obtained from the first polyimide precursor composition by heating in an amount so as to form the first polyimide.

22. A wiring structure according to claim 12 wherein the first polyimide is obtained from the first polyimide precursor composition by heating in an amount so as to form the first polyimide.

23. A wiring structure according to claim 12 wherein the second polyimide has a thermal expansion coefficient in a range of $4\times10^{-6}$/K to $18\times10^{-6}$/K.

24. A wiring structure having a wiring layer and an insulation layer, the wiring layer having a wiring, wherein at least a part of the wiring of said wiring layer comprises copper, and wherein said insulation layer has at least a first insulation film formed on said wiring layer and a second insulation film formed on said first insulation film;

wherein
the first insulation film comprises a first polyimide obtained from a first polyimide precursor composition containing a first polyimide precursor having low acidity and provided with the repeating unit represented by the general formula (Chemical formula 1);

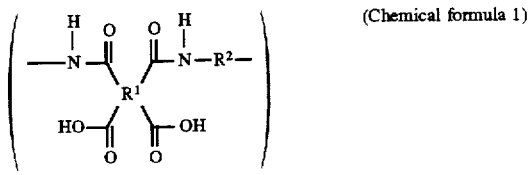

(Chemical formula 1)

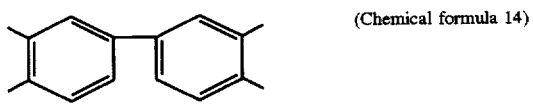

(Chemical formula 14)

(where $R^1$ is a quadrivalent organic group represented by the (Chemical formula 14), and $R^2$ is a bivalent organic group containing an aromatic ring;

and wherein said second insulation film comprises a second polyimide having a smaller thermal expansion coefficient than that of said first polyimide.

25. A wiring structure according to claim 24 wherein said $R^2$ is at least one type of a bivalent organic group selected from among the following Chemical formulae 3:

(Chemical formulae 3)

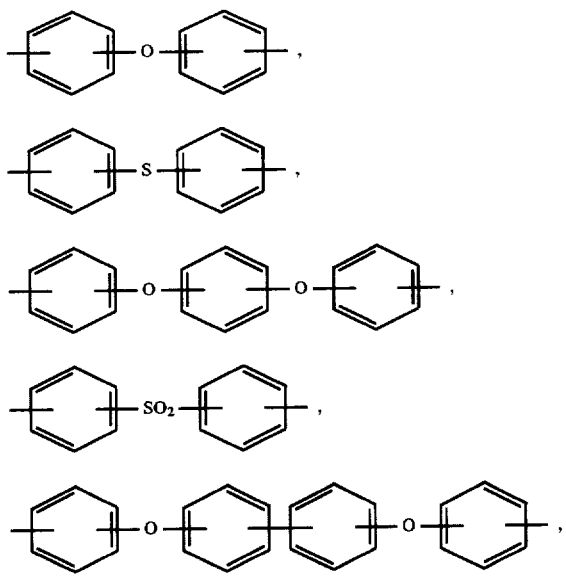

-continued
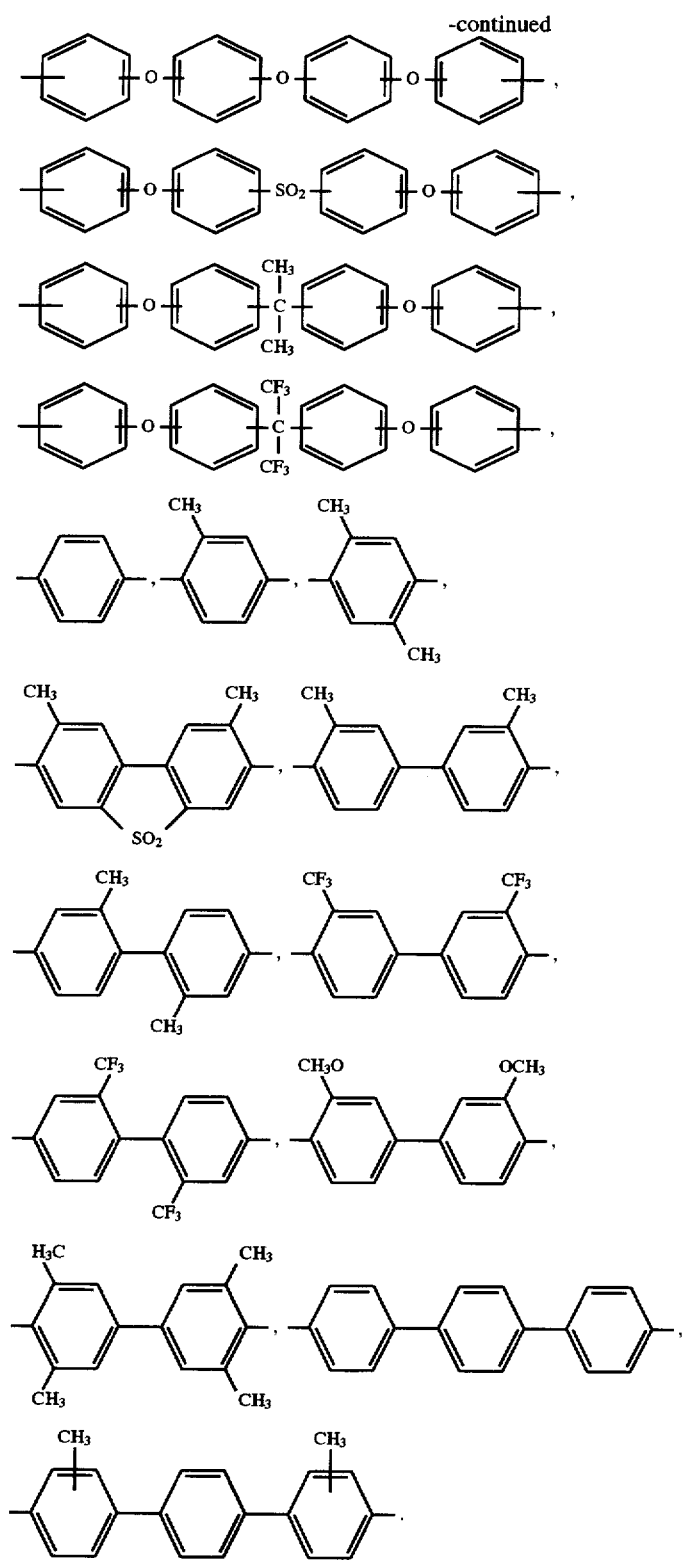
26. A wiring structure according to claim 24 wherein a thickness of said first insulation film is smaller than that of said second insulation film.
27. A wiring structure according to claim 24 wherein said first polyimide precursor composition includes at least one type of basic compound selected from among the following
Chemical formula 4:
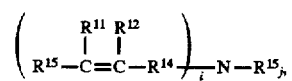
(Chemical formula 4)

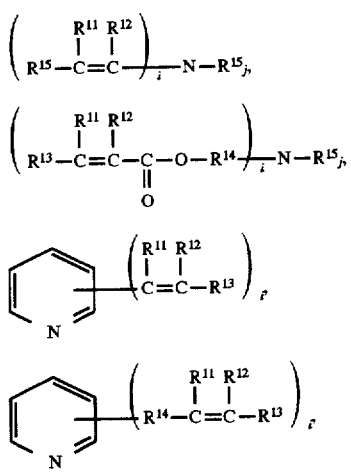

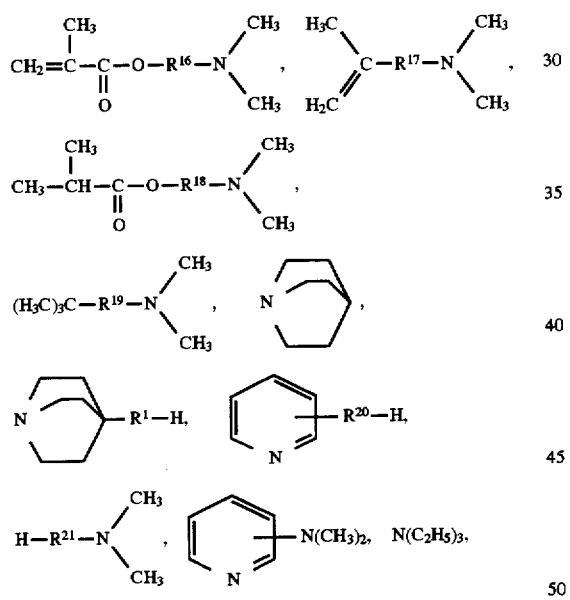

(where $R^{11}$, $R^{12}$, $R^{13}$ are groups selected from among the alkyl group, phenyl group and vinyl group with a hydrogen and carbon number 1 to 4, and $R^{14}$ is alkylene group, while R15 is a group selected from the alkyl group, phenyl group and vinyl group with a carbon number 1 to 4, and i+j=3 and i=1 to 3).

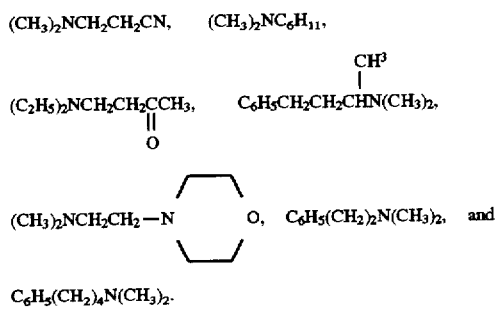

(where each of $R^{16}$ to $R^{21}$ is at least one type of group selected from among the alkylene group and phenylene group with a carbon number 1 to 6), $(CH_3)_2NCH_2CH_2CN$,   $(CH_3)_2NC_6H_{11}$, $(C_2H_5)_2NCH_2CH_2CCH_3$,   $C_6H_5CH_2CH_2CHN(CH_3)_2$,
           ||                         |
           O                         $CH^3$ $(CH_3)_2NCH_2CH_2-N\diagup\diagdown O$,   $C_6H_5(CH_2)_2N(CH_3)_2$, and $C_6H_5(CH_2)_4N(CH_3)_2$.

28. A wiring structure according to claim 24 characterized in that (1) said second polyimide has as a repeating unit the structure represented by the following general formulae (Chemical formula 5) and (Chemical formula 6); and (2) said second polyimide is a polyimide obtained from a second polyimide precursor composition containing a second polyimide precursor wherein the number of the repeating units represented by the general formula (Chemical formula 5) is less than 95, while that of the repeating units represented by the general formula (Chemical formula 6) is 5 or more, when the total of the number of the repeating units represented by the general formula (Chemical formula 5) contained in one molecule and that of the repeating units represented by the general formula (Chemical formula 6) is assumed as 100:

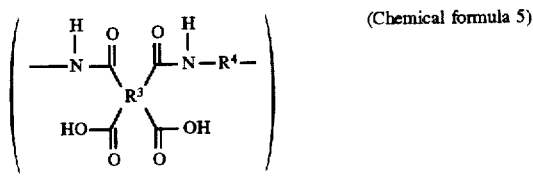
(Chemical formula 5)

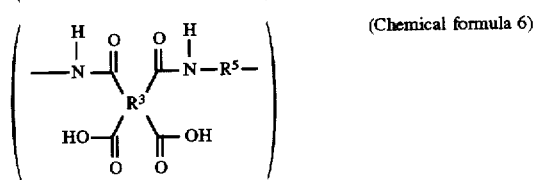
(Chemical formula 6)

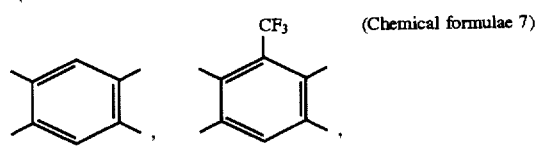
(Chemical formulae 7)

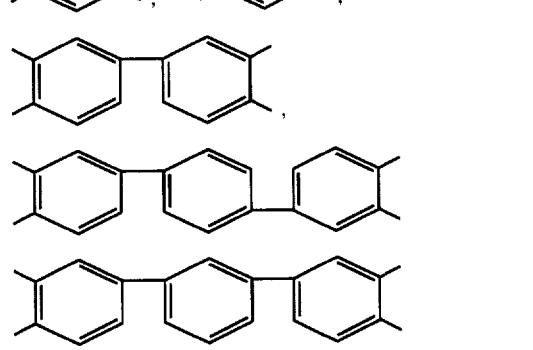

(where $R^3$ is at least one type of quadrivalent organic group selected from among Chemical formulae 7, and $R^4$ is at least one type of bivalent organic group selected from among the following Chemical formulae 8, while $R^5$ is at least one type of bivalent organic group selected from among the following Chemical formulae 9),

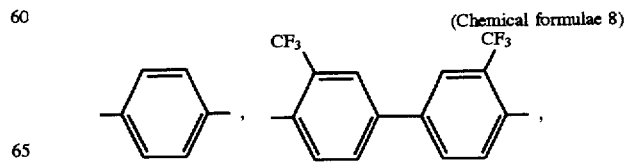
(Chemical formulae 8)

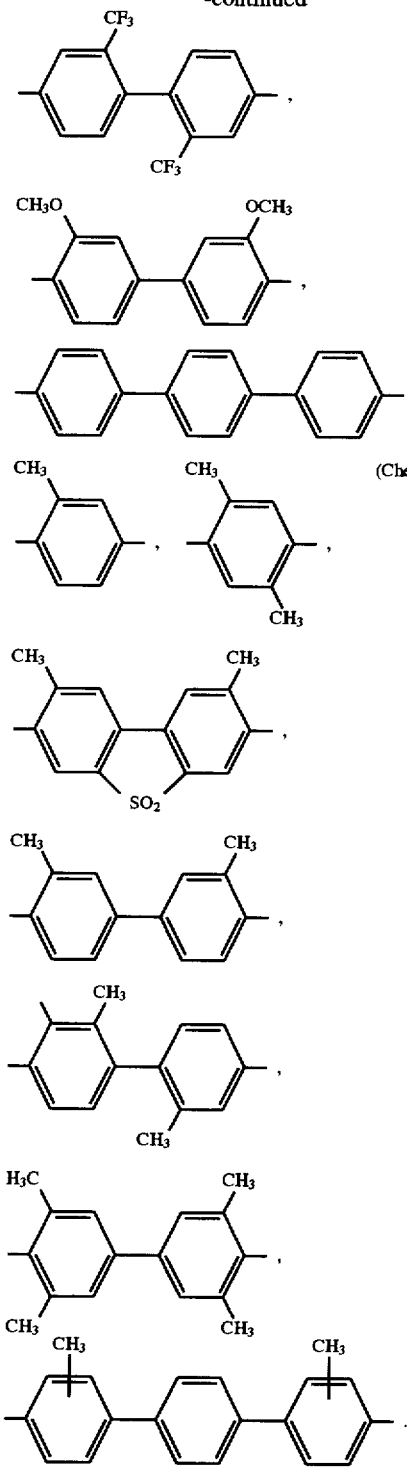

(Chemical formula 9)

29. A wiring structure according to claim 28 wherein the second polyimide is obtained from the second polyimide precursor composition by heating in an amount so as to form the second polyimide.

30. A wiring structure according to claim 29 wherein the first polyimide is obtained from the first polyimide precursor composition by heating in an amount so as to form the first polyimide.

31. A wiring structure according to claim 24 characterized in that (1) said second polyimide has as a repeating unit the structure represented by the following general formula (Chemical formula 10) and (Chemical formula 11); and (2) said second polyimide is a polyimide obtained from a second polyimide precursor composition containing the second polyimide precursor;

wherein the number of the repeating units represented by the general formula (Chemical formula 10) is from 85 to 50, while that of the repeating units represented by the general formula (Chemical formula 11) is from 50 to 15, when the total of the number of the repeating units represented by the general formula (Chemical formula 10) contained in one molecule and that of the repeating units represented by the general formula (Chemical formula 11) is assumed as 100:

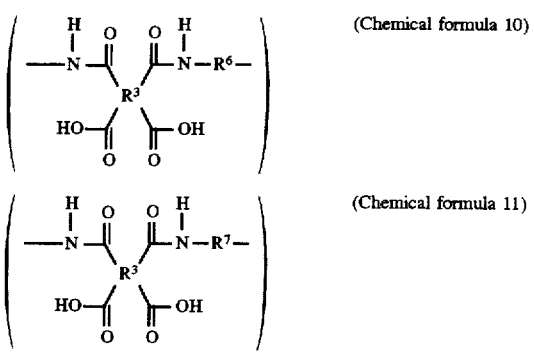

(Chemical formula 10)

(Chemical formula 11)

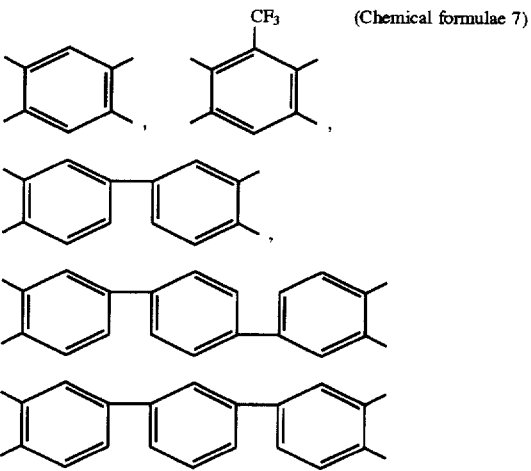

(Chemical formulae 7)

(where $R^3$ is at least one type of quadrivalent organic group selected from among Chemical formulae 7, and $R^6$ is at least one type of bivalent organic group selected from among the following Chemical formulae 12, while $R^7$ is at least one type of bivalent organic group selected from among the following Chemical formulae 13:

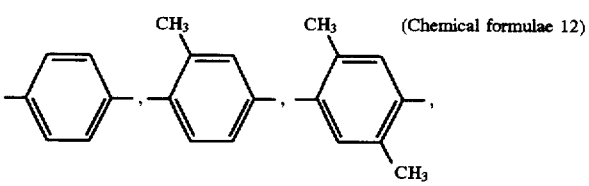

(Chemical formulae 12)

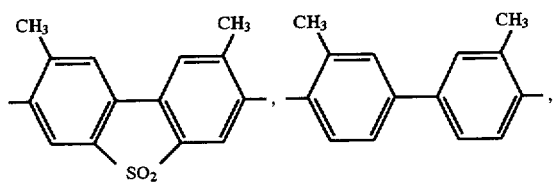
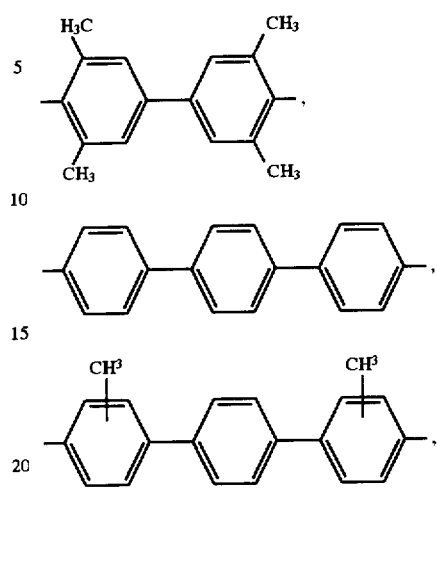
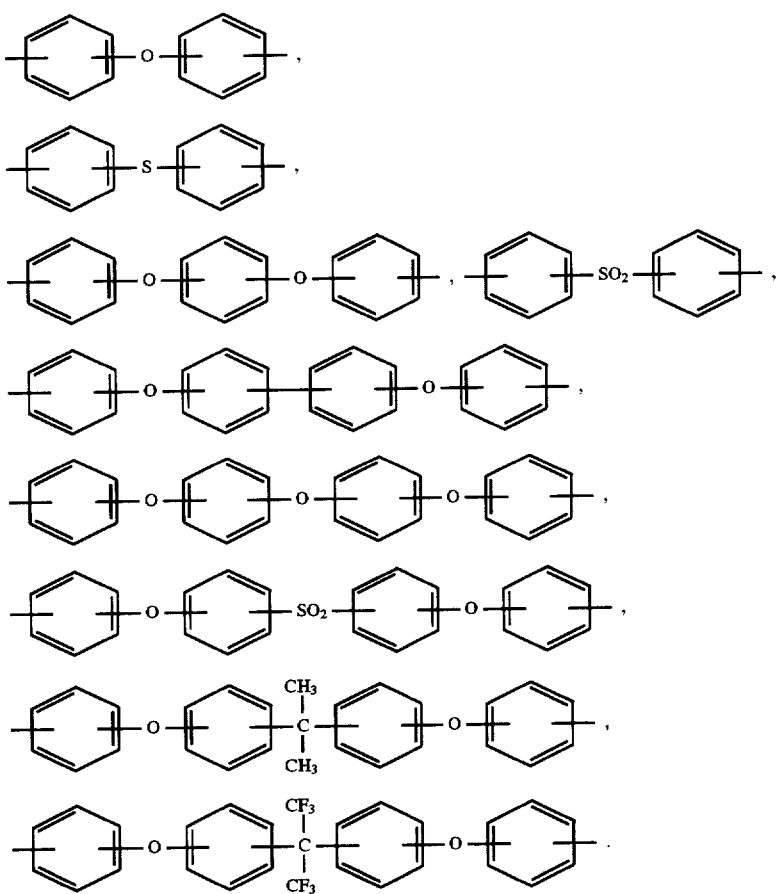
(Chemical formulae 13)

32. A wiring structure according to claim 31 wherein the second polyimide is obtained from the second polyimide precursor composition by heating in an amount so as to form the second polyimide.

33. A wiring structure according to claim 32 wherein the first polyimide is obtained from the first polyimide precursor composition by heating in an amount so as to form the first polyimide.

34. A wiring structure according to claim 24 wherein the first polyimide is obtained from the first polyimide precursor composition by heating in an amount so as to form the first polyimide.

35. A wiring structure according to claim 24 wherein the second polyimide has a thermal expansion coefficient in a range of $4 \times 10^{-6}$/K to $18 \times 10^{-6}$/K.

* * * * *